United States Patent
Ki et al.

(10) Patent No.: US 12,507,581 B2
(45) Date of Patent: Dec. 23, 2025

(54) METHOD OF MANUFACTURING DISPLAY PANEL

(71) Applicant: Samsung Display Co., Ltd., Yongin-Si (KR)

(72) Inventors: Wonjang Ki, Yongin-si (KR); Dongwook Kim, Yongin-si (KR); Jinho Kim, Yongin-si (KR); Hyejin Kim, Yongin-si (KR); Hyekyung Lee, Yongin-si (KR); Hongbeom Lee, Yongin-si (KR); Soyul Jeon, Yongin-si (KR); Eyoon Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 505 days.

(21) Appl. No.: 17/824,709

(22) Filed: May 25, 2022

(65) Prior Publication Data
US 2023/0200197 A1 Jun. 22, 2023

(30) Foreign Application Priority Data
Dec. 16, 2021 (KR) .................... 10-2021-0181029

(51) Int. Cl.
*H10K 59/124* (2023.01)
*H10K 59/80* (2023.01)
*H10K 71/00* (2023.01)
*H10K 59/12* (2023.01)

(52) U.S. Cl.
CPC .......... *H10K 71/00* (2023.02); *H10K 59/124* (2023.02); *H10K 59/873* (2023.02); *H10K 59/1201* (2023.02)

(58) Field of Classification Search
CPC ...................... H10K 59/124; H10K 59/60–65
See application file for complete search history.

(56) References Cited

U.S. PATENT DOCUMENTS

| 9,831,138 B2 | 11/2017 | Lee et al. |
| 2020/0235180 A1 | 7/2020 | Park et al. |
| 2020/0303479 A1* | 9/2020 | Kim .................. H10K 59/1213 |

(Continued)

FOREIGN PATENT DOCUMENTS

| KR | 20110004170 A | * | 1/2011 |
| KR | 10-2015-0021169 A | | 3/2015 |
| KR | 10-2015-0083325 A | | 7/2015 |

(Continued)

OTHER PUBLICATIONS

KR-20110004170-A, machine translation (Year: 2011).*

*Primary Examiner* — Evan G Clinton
(74) *Attorney, Agent, or Firm* — Innovation Counsel LLP

(57) ABSTRACT

A method of manufacturing a display panel includes preparing a substrate including a first area, a second area surrounding the first area, and a third area disposed between the first area and the second area, forming a first organic insulating layer in the third area, forming a metal material layer in the third area on the first organic insulating layer, forming a mask layer on the metal material layer, the mask layer comprising a first portion and a second portion spaced apart from each other, removing the metal material layer and the first organic insulating layer exposed by the mask layer by using the mask layer as a mask, and forming a light-emitting diode in the second area.

16 Claims, 20 Drawing Sheets

(56) References Cited

U.S. PATENT DOCUMENTS

2020/0303677 A1   9/2020  Lee et al.
2021/0126060 A1   4/2021  Koo et al.

FOREIGN PATENT DOCUMENTS

| KR | 10-2017-0017447 A | 2/2017 |
|---|---|---|
| KR | 10-2058706 B1 | 12/2019 |
| KR | 10-2020-0090595 A | 7/2020 |
| KR | 10-2020-0113092 A | 10/2020 |
| KR | 10-2193043 B1 | 12/2020 |
| KR | 10-2228839 B1 | 3/2021 |
| KR | 10-2021-0049253 A | 5/2021 |

* cited by examiner

METHOD OF MANUFACTURING DISPLAY PANEL

CROSS-REFERENCE TO RELATED APPLICATION

This application is based on and claims priority under 35 U.S.C. § 119 to Korean Patent Application No. 10-2021-0181029, filed on Dec. 16, 2021, in the Korean Intellectual Property Office, the disclosure of which is incorporated by reference herein in its entirety.

BACKGROUND

1. Field

One or more embodiments relate to a method of manufacturing the display panel including an opening area inside a display area.

2. Description of the Related Art

Recently, display panels have been used for various purposes. Also, as thicknesses and weights of display panels have decreased, the range of applications of display panels has increased.

As an area occupied by a display area in a display panel increases, various functions linked to or associated with the display panel are added. In order to add various functions while increasing the display area, research on a display apparatus capable of arranging various components in a display area is being conducted.

SUMMARY

One or more embodiments include a display panel including an opening area in which various types of components may be located in a display area. However, the embodiments are examples, and do not limit the scope of the disclosure.

Additional aspects will be set forth in part in the description which follows and, in part, will be apparent from the description, or may be learned by practice of the presented embodiments.

According to one or more embodiments, a method of manufacturing a display panel includes preparing a substrate comprising a first area, a second area surrounding the first area, and a third area disposed between the first area and the second area, forming a first organic insulating layer in the third area, forming a metal material layer in the third area on the first organic insulating layer, forming a mask layer on the metal material layer, the mask layer comprising a first portion and a second portion spaced apart from each other, removing the metal material layer and the first organic insulating layer exposed by the mask layer by using the mask layer as a mask, and forming a light-emitting diode in the second area.

The removing of the metal material layer and the first organic insulating layer may include forming two metal pattern layers spaced apart from each other by a first interval by removing the metal material layer exposed by the mask layer, forming an opening in the first organic insulating layer by removing the first organic insulating layer exposed by the mask layer, and removing the mask layer.

The first organic insulating layer may include a recessed portion exposing bottom surfaces of the two metal pattern layers, and end portions of the two metal pattern layers may comprise tips extending toward a center of the opening.

The method may further include forming a second organic insulating layer located on the two metal pattern layers and including a first portion and a second portion spaced apart from each other by a second interval.

The second interval may be greater than the first interval.

The forming of the opening in the first organic insulating layer may include etching the first organic insulating layer using a lower layer disposed below the first organic insulating layer in an area corresponding to the opening as an etch stopper.

The lower layer may include an oxide-based semiconductor material.

The method may further include forming an inorganic insulating material under the first organic insulating layer, the inorganic insulating material comprising an opening disposed in a region corresponding to a region exposed by the mask layer.

The method may further include forming first metal layers disposed under the first organic insulating layer and spaced apart from each other with the first organic insulating layer disposed therebetween.

The forming of the first organic insulating layer may include forming dummy contact holes exposing the first metal layers.

The metal material layer may contact the first metal layers through the dummy contact holes.

According to one or more embodiments, a method of manufacturing a display panel includes preparing a substrate comprising a first area, a second area surrounding the first area, and a third area disposed between the first area and the second area, forming a first organic insulating layer in the third area, for forming two metal pattern layers in the third area on the first organic insulating layer, wherein the two metal pattern layers are spaced apart from each other by a first interval, forming a second organic insulating layer comprising an opening in a region corresponding to the first interval, removing the first organic insulating layer exposed by the opening in the second organic insulating layer, and forming a light-emitting diode in the second area.

A width of the opening in the second organic insulating layer may be less than the first interval.

The two metal pattern layers may include end portions facing each other, and each side surface of the end portions of the two metal patterns may be covered by the second organic insulating layer.

The removing of the first organic insulating layer may include etching the first organic insulating layer using a lower layer disposed below the first organic insulating layer in an area corresponding to the opening as an etch stopper, wherein a width of the opening in the second organic insulating layer may be increased during the etching to expose the end portions of the two metal pattern layers through the opening in the second organic insulating layer.

The lower layer may include an oxide semiconductor material.

The method may further include forming an inorganic insulating material under the first organic insulating layer, the inorganic insulating material comprising an opening disposed in the region corresponding to the first interval.

The method may further include forming first metal layers disposed under the first organic insulating layer and spaced apart from each other with the first organic insulating layer disposed therebetween.

The forming of the first organic insulating layer may include forming a dummy contact hole exposing the first metal layers.

Each of the two metal pattern layers may contact each of the first metal layers through the dummy contact hole.

BRIEF DESCRIPTION OF THE DRAWINGS

The above and other aspects, features, and advantages of certain embodiments will be more apparent from the following description taken in conjunction with the accompanying drawings, in which.

DETAILED DESCRIPTION

Figure 1:
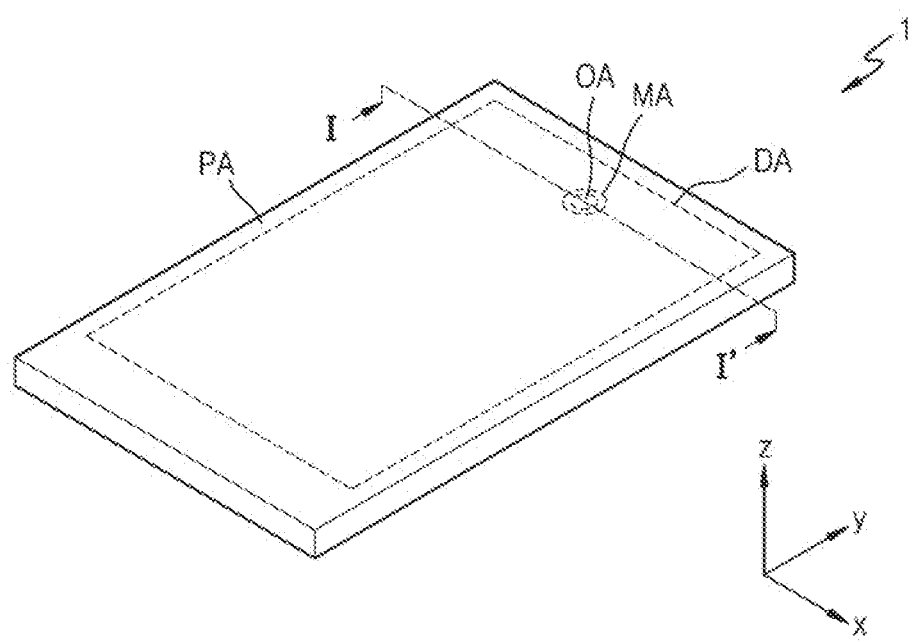
FIG. 1 is a perspective view illustrating an electronic device, according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, certain embodiments will be illustrated in the drawings and described in the detailed description. Effects and features of the disclosure, and methods for achieving them will be clarified with reference to embodiments described below in detail with reference to the drawings. However, the disclosure is not limited to the following embodiments and may be embodied in various forms.

Hereinafter, embodiments will be described in detail with reference to the accompanying drawings, wherein the same or corresponding elements are denoted by the same reference numerals throughout and a repeated description thereof is omitted.

Although the terms "first," "second," etc. may be used to describe various elements, these elements should not be limited by these terms. These terms are only used to distinguish one element from another.

As used herein, the singular forms "a," "an," and "the" are intended to include the plural forms as well, unless the context clearly indicates otherwise.

It will be understood that the terms "including," "having," and "comprising" are intended to indicate the existence of the features or elements described in the specification, and are not intended to preclude the possibility that one or more other features or elements may exist or may be added.

It will be further understood that, when a layer, region, or component is referred to as being "on" another layer, region, or component, it may be directly on the other layer, region, or component, or may be indirectly on the other layer, region, or component with intervening layers, regions, or components therebetween.

Sizes of components in the drawings may be exaggerated or contracted for convenience of explanation. For example, because sizes and thicknesses of elements in the drawings are arbitrarily illustrated for convenience of explanation, the disclosure is not limited thereto.

When a certain embodiment may be implemented differently, a specific process order may be different from the described order. For example, two consecutively described processes may be performed substantially at the same time or may be performed in an order opposite to the described order.

"A and/or B" is used herein to select only A, select only B, or select both A and B. "At least one of A and B" is used to select only A, select only B, or select both A and B.

It will be understood that when a layer, an area, or an element is referred to as being "connected" to another layer, area, or element, it may be "directly connected" to the other layer, area, or element and/or may be "indirectly connected" to the other layer, area, or element with other layers, areas, or elements interposed therebetween. For example, when a layer, an area, or an element is referred to as being "electrically connected," it may be directly electrically connected, and/or may be indirectly electrically connected with intervening layers, areas, or elements therebetween.

FIG. 1 is a perspective view illustrating an electronic device, according to an embodiment.

Referring to FIG. 1, an electronic device 1 for displaying a moving image or a still image may be used as a display screen of not only a portable electronic device such as a mobile phone, a smartphone, a tablet personal (PC) computer, a mobile communication terminal, an electronic organizer, an electronic book, a portable multimedia player (PMP), a navigation device, or an ultra-mobile PC (UMPC) but also any of various products such as a television, a laptop computer, a monitor, an advertisement board, or an Internet of things (IoT) product. Also, the electronic device 1 according to an embodiment may be applied to a wearable device such as a smart watch, a watch phone, a glasses-type display, or a head-mounted display (HMD). Also, the electronic device 1 according to an embodiment may be used as a center information display (CID) located on an instrument panel, a center fascia, or a dashboard of a vehicle, a room mirror display replacing a side-view mirror of a vehicle, or a display located on the back of a front seat for entertainment for a back seat of a vehicle. For convenience of explanation, the electronic device 1 according to an embodiment is a smartphone as illustrated in FIG. 1.

The electronic device 1 may have a rectangular shape in a plan view. For example, as shown in FIG. 1, the electronic device 1 may have a rectangular shape having a short side in an x direction and a long side in a y direction in a plan view. A corner where the short side in the x direction and the long side in the y direction meet each other may be round to have a certain curvature or formed to have a right angle. However, a planar shape of the electronic device 1 is not limited to a rectangular shape and may be any of other shapes such as another polygonal shape, an elliptical shape, or an irregular shape.

The electronic device 1 may include an opening area OA (or a first area), and a display area DA (or a second area) at least surrounding the opening area OA. The electronic device 1 may include an intermediate area MA (or a third area) located between the opening area OA and the display area DA, and a peripheral area PA (or a fourth area) surrounding the display area DA. The intermediate area MA may have a closed-loop shape entirely surrounding the opening area OA in a plan view.

The opening area OA may be located inside the display area DA. In an embodiment, the opening area OA may be located in the upper center of the display area DA as shown in FIG. 1. Alternatively, the opening area OA may be located in various ways. For example, the opening area OA may be located in an upper left portion of the display area DA or an upper right portion of the display area DA. Although one opening area OA is provided in FIG. 1, in another embodiment, a plurality of opening areas OA may be provided.

Figure 2:
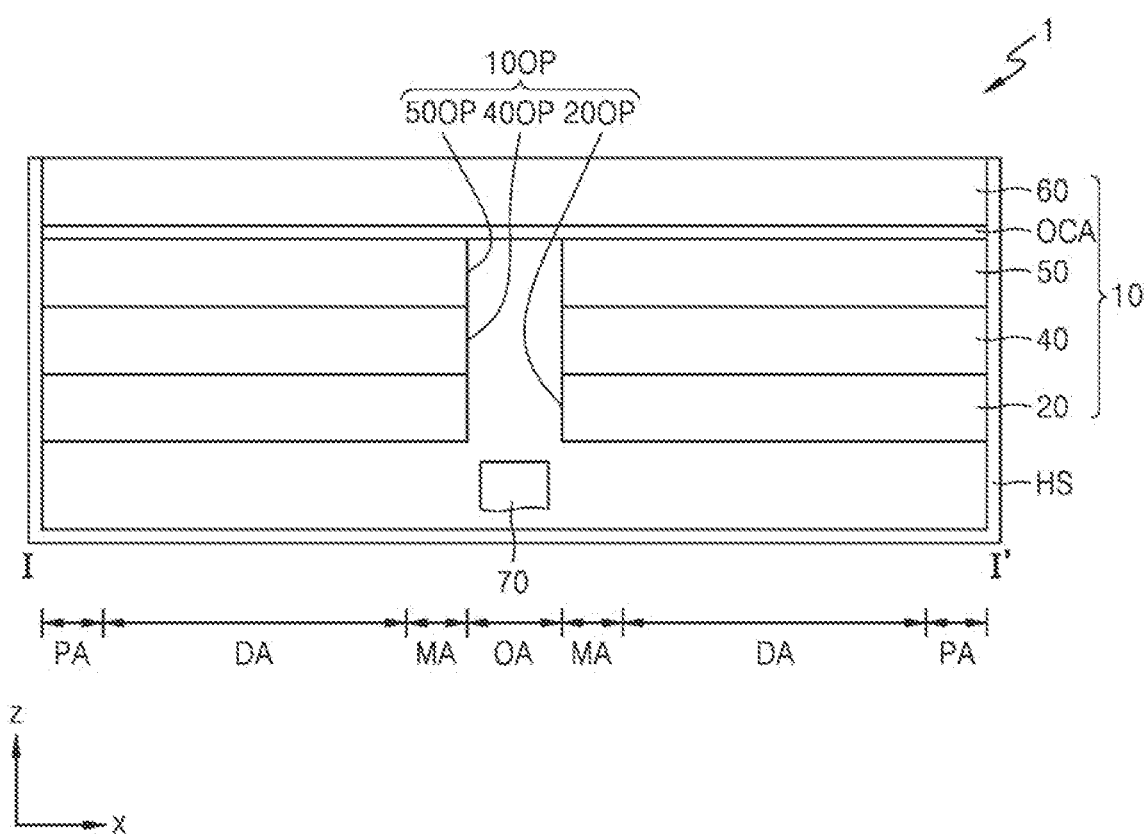
FIG. 2 is a cross-sectional view illustrating a display panel, taken along line I-I' of FIG. 1, according to an embodiment.

FIG. 2 is a cross-sectional view illustrating a display panel, taken along line I-I' of FIG. 1, according to an embodiment.

Referring to FIG. 2, the electronic device 1 may include a display panel 10 and a component 70 disposed in an area corresponding to the opening area OA of the display panel 10. The display panel 10 and the component 70 may be received in a housing HS.

The display panel 10 may include an image generating layer 20, an input sensing layer 40, an optical functional layer 50, and a cover window 60.

The image generating layer 20 may include display elements (or light-emitting elements) that emit light to display an image. Each of the display elements may include a light-emitting diode, for example, an organic light-emitting diode including an organic emission layer. In another embodiment, the light-emitting diode may be an inorganic light-emitting diode including an inorganic material. The inorganic light-emitting diode may include a PN junction diode including inorganic semiconductor-based materials. When a voltage is applied to a PN junction diode in a forward direction, holes and electrons may be injected, and energy generated by recombination of the holes and electrons may be converted into light energy to emit light of a certain color. The inorganic light-emitting diode may have a width of several to hundreds of micrometers, or several to hundreds of nanometers. In some embodiments, the image generating layer 20 may include a quantum-dot light-emitting diode. For example, an emission layer of the image generating layer 20 may include an organic material, may include an inorganic material, may include quantum dots, may include an organic material and quantum dots, or may include an inorganic material and quantum dots.

The input sensing layer 40 may obtain coordinate information of an external input, for example, a touch event. The input sensing layer 40 may include a sensing electrode (or a touch electrode) and trace lines connected to the sensing electrode. The input sensing layer 40 may be located on the image generating layer 20. The input sensing layer 40 may detect the external input by using a mutual capacitance method and/or a self-capacitance method.

The input sensing layer 40 may be formed directly on the image generating layer 20, or may be separately formed and then may be coupled to the image generating layer 20 through an adhesive layer such as an optically clear adhesive. For example, the input sensing layer 40 may be continuously formed after the image generating layer 20 is formed, and in this case, the adhesive layer may not be located between the input sensing layer 40 and the image generating layer 20. Although the input sensing layer 40 is located between the image generating layer 20 and the optical functional layer 50 in FIG. 2, in another embodiment, the input sensing layer 40 may be located over the optical functional layer 50.

The optical functional layer 50 may include an anti-reflection layer. The anti-reflection layer may reduce a reflectance of light (external light) incident on the display panel 10 through the cover window 60. The anti-reflection layer may include a phase retarder and a polarizer. In another embodiment, the anti-reflection layer may include a black matrix and color filters. The color filters may be arranged in consideration of a color of light emitted by each of the light-emitting diodes of the image generating layer 20.

In order to increase a transmittance of the opening area OA, the display panel 10 may include an opening 10OP passing through some of layers constituting the display panel 10. The opening 10OP may include first through third openings 20OP, 40OP, and 50OP respectively passing through the image generating layer 20, the input sensing layer 40, and the optical functional layer 50. The first opening 20OP of the image generating layer 20, the second opening 40OP of the input sensing layer 40, and the third opening 50OP of the optical functional layer 50 may overlap one another to form the opening 10OP of the display panel 10.

The cover window 60 may be located on the optical functional layer 50. The cover window 60 may be coupled to the optical functional layer 50 through an adhesive layer such as an optically clear adhesive (OCA) located between the cover window 60 and the optical functional layer 50. The cover window 60 may cover the first opening 20OP of the image generating layer 20, the second opening 40OP of the input sensing layer 40, and the third opening 50OP of the optical functional layer 50.

The cover window 60 may include a glass material or a plastic material. The glass material may include ultra-thin glass. Examples of the plastic material may include polyethersulfone, polyacrylate, polyetherimide, polyethylene naphthalate, polyethylene terephthalate, polyphenylene sulfide, polyarylate, polyimide, polycarbonate, and cellulose acetate propionate.

The opening area OA may be a component area (e.g., a sensor area, a camera area, or a speaker area) in which the component 70 for adding various functions to the electronic device 1 is located.

The component 70 may include an electronic element. For example, the component 70 may be an electronic element using light or sound. For example, the electronic element may include a sensor that uses light such as an infrared sensor, a camera that captures an image by receiving light, a sensor that measures a distance or recognizes a fingerprint by outputting and detecting light or sound, a small lamp that outputs light, or a speaker that outputs sound. When the component 70 is an electronic element using light, the component 70 may use light of various wavelength bands such as visible light, infrared light, or ultraviolet light. The opening area OA corresponds to an area through which light and/or sound output from the component 70 to the outside or traveling from the outside toward the component 70 may be transmitted.

Figure 3:
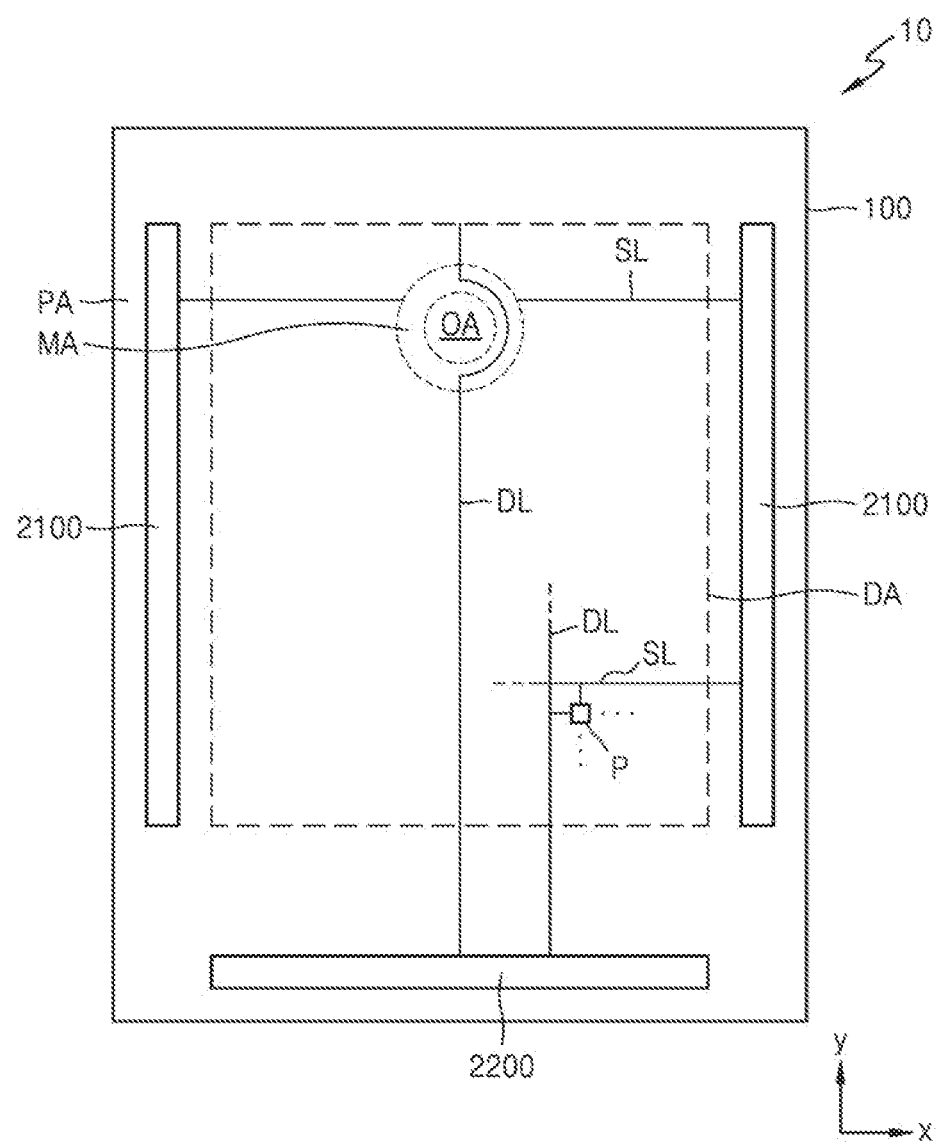
FIG. 3 is a plan view illustrating a display panel, according to an embodiment.

FIG. 3 is a plan view illustrating a display panel, according to an embodiment.

Referring to FIG. 3, the display panel 10 may include the opening area OA, the display area DA, the intermediate area MA, and the peripheral area PA.

The display panel 10 may include a plurality of sub-pixels P located in the display area DA, and may display an image by using light emitted by each of the sub-pixels P. Each sub-pixel P may emit red light, green light, or blue light by using a light-emitting diode. The light-emitting diode of each sub-pixel may be electrically connected to a scan line SL and a data line DL.

In the peripheral area PA, scan drivers 2100 for applying a scan signal to each sub-pixel P, a data driver 2200 for applying a data signal to each sub-pixel P, and a first main power supply wiring (not shown) and a second main power supply wiring (not shown) for respectively supplying a first power supply voltage and a second power supply voltage may be located. The scan drivers 2100 may be located on both sides of the display area DA with the display area DA disposed therebetween. In this case, the sub-pixel P located on the left of the opening area OA may be connected to the scan driver 2100 located on the left, and the sub-pixel P located on the right of the opening area OA may be connected to the scan driver 2100 located on the right.

The intermediate area MA may surround the opening area OA. The intermediate area MA is an area where a display element such as a light-emitting diode that emits light is not disposed, and signal lines for applying signals to the sub-pixels P located around the opening area OA may pass through the intermediate area MA. For example, the data lines DL and/or the scan lines SL may cross the display area DA, and portions of the data lines DL and/or the scan lines SL may bypass in the intermediate area MA along an edge of an opening 10OP of the display panel 10 formed in the opening area OA. In an embodiment, in FIG. 3, the data lines DL cross the display area DA in the y direction, and some data lines DL bypass the opening area OA through the intermediate area MA to partially surround the opening area OA. The scan lines SL may cross the display area DA in the x direction and may be disconnected from each other in the opening area OA.

Although the data driver 2200 is located adjacent to a side of a substrate 100 in FIG. 3, in another embodiment, the data driver 2200 may be located on a circuit board (e.g., a printed circuit board) electrically connected to a pad located on a side of the display panel 10. The circuit board may be flexible, and a part of the circuit board may be bent to be disposed under a bottom surface of the substrate 100.

Figure 4:
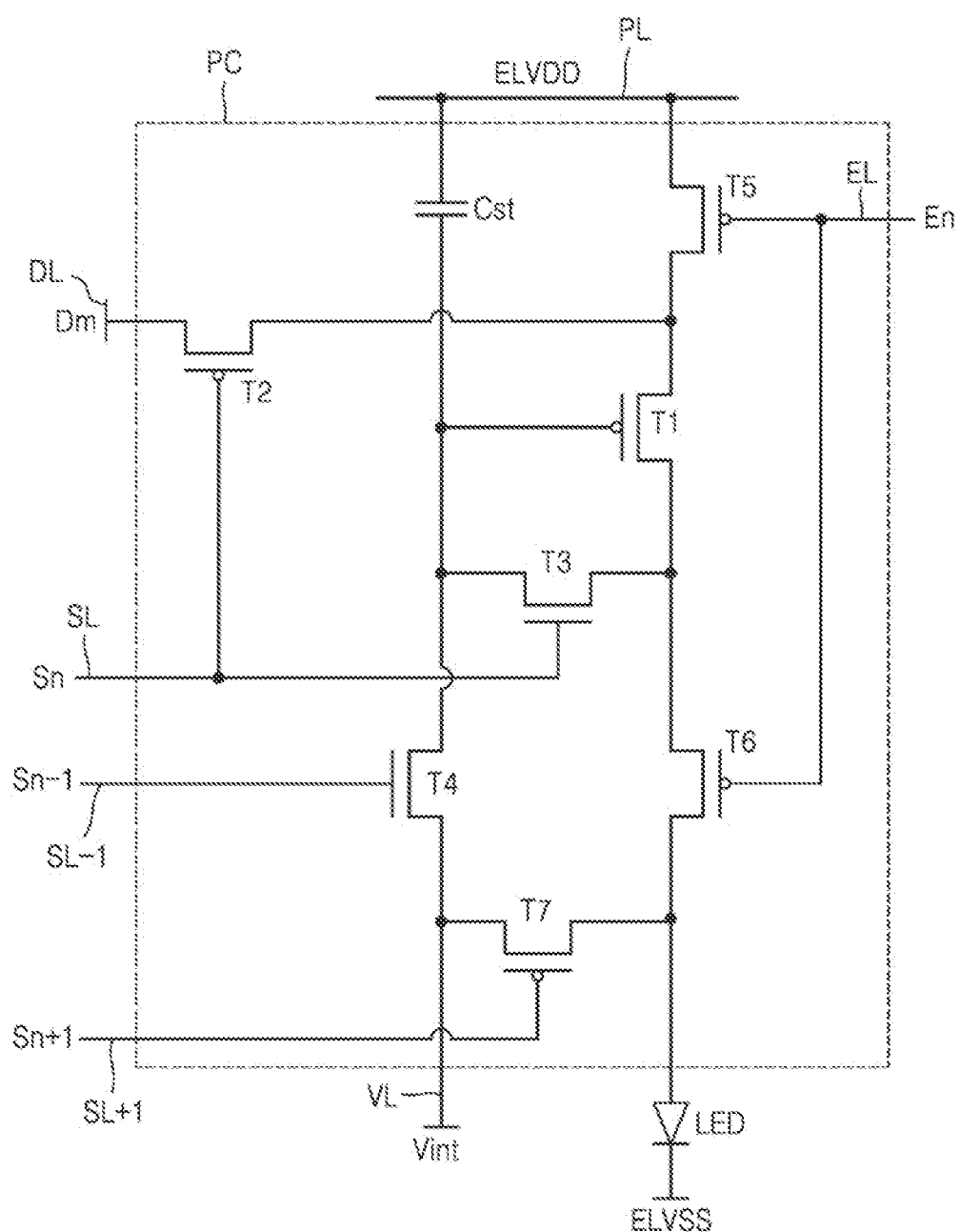
FIG. 4 is an equivalent circuit diagram illustrating a light-emitting diode corresponding to a sub-pixel and a circuit connected to the light-emitting diode, according to an embodiment.

FIG. 4 is an equivalent circuit diagram illustrating a light-emitting diode corresponding to a sub-pixel and a circuit connected to the light-emitting diode, according to an embodiment.

Referring to FIG. 4, the sub-pixel P of FIG. 3 may emit light through a light-emitting diode LED, and the light-emitting diode LED may be electrically connected to a sub-pixel circuit PC.

The sub-pixel circuit PC may include a first transistor T1, a second transistor T2, a third transistor T3, a fourth transistor T4, a fifth transistor T5, a sixth transistor T6, a seventh transistor T7, and a storage capacitor Cst.

The second transistor T2 that is a switching transistor may be connected to the scan line SL and the data line DL, and may transmit a data voltage (or a data signal Dm) input from the data line DL to the first transistor T1 in response to a switching voltage (or a switching signal Sn) input from the scan line SL. The storage capacitor Cst may be connected between the second transistor T2 and a driving voltage line PL, and may store a voltage corresponding to a difference between a voltage received from the second transistor T2 and a first power supply voltage ELVDD supplied to the driving voltage line PL.

The first transistor T1 that is a driving transistor may be connected between the driving voltage line PL and the light-emitting diode LED, and may control driving current flowing from the driving voltage line PL to the light-emitting diode LED according to the voltage stored in the storage capacitor Cst. The light-emitting diode LED may emit light having a certain luminance according to the driving current. A second electrode (e.g., a cathode) of the light-emitting diode LED may receive a second power supply voltage ELVSS.

A gate electrode of the third transistor T3 that is a compensation transistor may be connected to the scan line SL. A source electrode (or a drain electrode) of the third transistor T3 may be connected to a drain electrode (or a source electrode) of the first transistor T1 and may be connected to a first electrode of the light-emitting diode LED via the sixth transistor T6. The drain electrode (or the source electrode) of the third transistor T3 may be connected to one electrode of the storage capacitor Cst, a source electrode (or a drain electrode) of the fourth transistor T4, and a gate electrode of the first transistor T1. The compensation transistor T3 may be turned on in response to the scan signal Sn received through the scan line SL, and may diode-connect the first transistor T1 by connecting the gate electrode to the drain electrode of the first transistor T1.

A gate electrode of the fourth transistor T4 that is an initialization transistor may be connected to a previous scan line SL-1. The drain electrode (or the source electrode) of the fourth transistor T4 may be connected to an initialization voltage line VL. The source electrode (or the drain electrode) of the fourth transistor T4 may be connected to one electrode of the storage capacitor Cst, the drain electrode (or the source electrode) of the third transistor T3, and the gate electrode of the first transistor T1. The first initialization transistor T4 may be turned on in response to a previous scan signal Sn−1 received through the previous scan line SL-1 and may perform an initialization operation of initializing a voltage of the gate electrode of the first transistor T1 by supplying an initialization voltage Vint to the gate electrode of the first transistor T1.

A gate electrode of the fifth transistor T5 that is an operation control transistor may be connected to an emission control line EL. A source electrode (or a drain electrode) of the fifth transistor T5 may be connected to the driving voltage line PL. The drain electrode (or the source electrode) of the fifth transistor T5 is connected to the source electrode (or the drain electrode) of the first transistor T1 and a drain electrode (or a source electrode) of the second transistor T2.

A gate electrode of the sixth transistor T6 that is an emission control transistor may be connected to the emission control line EL. A source electrode (or a drain electrode) of the sixth transistor T6 may be connected to the drain electrode (or the source electrode) of the first transistor T1 and the source electrode (or the drain electrode) of the third transistor T3. The drain electrode (or the source electrode) of the sixth transistor T6 may be electrically connected to the first electrode of the light-emitting diode LED. The fifth transistor T5 and the sixth transistor T6 may be simultaneously turned on in response to an emission control signal En received through the emission control line EL, and thus, the driving voltage ELVDD is supplied to the light-emitting diode LED and driving current flows through the light-emitting diode LED.

The seventh transistor T7 may be an initialization transistor for initializing the first electrode of the light-emitting diode LED. A gate electrode of the seventh transistor T7 may be connected to a next scan line SL+1. A source electrode (or a drain electrode) of the seventh transistor T7 may be connected to the first electrode of the light-emitting diode LED. The drain electrode (or the source electrode) of the seventh transistor T7 may be connected to the initialization voltage line VL. The seventh transistor T7 may be turned on in response to a next scan signal Sn+1 received through the next scan line SL+1, and may initialize the first electrode of the light-emitting diode LED.

Another electrode of the storage capacitor Cst may be connected to the driving voltage line PL. Any one electrode of the storage capacitor Cst may be connected to the gate electrode of the first transistor T1, the drain electrode (or the source electrode) of the third transistor T3, and the source electrode (or the drain electrode) of the fourth transistor T4.

The second electrode (e.g., cathode) of the light-emitting diode LED receives the common voltage ELVSS. The light-emitting diode LED receives driving current from the first transistor T1 and emits light.

At least one of the first through seventh transistors T1 through T7 of the sub-pixel circuit PC may include a semiconductor layer including an oxide, and the rest may include a semiconductor layer including silicon. In FIG. 4, the third transistor T3 and the fourth transistor T4 are implemented as n-channel MOSFETs (NMOSs), and the first transistor T1, the second transistor T2, the fifth transistor T5, the sixth transistor T6, and the seventh transistor T7 are implemented as p-channel MOSFETs (PMOSs). In another example, the third transistor T3 may be implemented as an NMOS, and the first transistor T1, the second transistor T2, the fourth transistor T4, the fifth transistor T5, the sixth transistor T6, and the seventh transistor T7 may be implemented as PMOSs.

In detail, the first transistor T1 that directly affects the brightness of a display apparatus may include a semiconductor layer formed of polycrystalline silicon having high reliability, thereby realizing a high-resolution display panel.

Because an oxide semiconductor has high carrier mobility and low leakage current, voltage drop is not large even when a driving time is long. That is, because a color change in an image due to voltage drop is not large even during low frequency driving, low frequency driving is possible. As such, because an oxide semiconductor has small leakage current, when at least one of the third transistor T3 and the fourth transistor T4 connected to the gate electrode of the first transistor T1 includes an oxide semiconductor, leakage current from the gate electrode of the first transistor T1 may be prevented and power consumption may be reduced.

Figure 5:
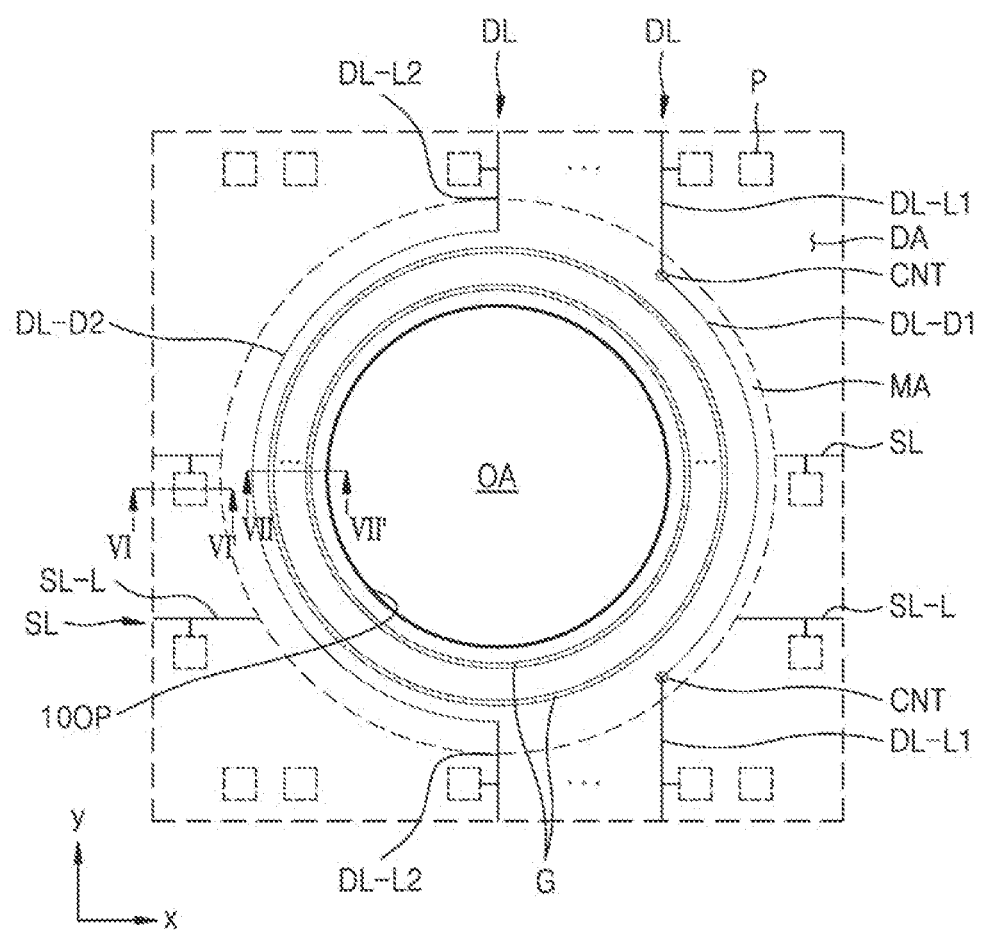
FIG. 5 is a plan view illustrating a part of a display panel, according to an embodiment.

FIG. 5 is a plan view illustrating a part of a display panel, according to an embodiment.

Referring to FIG. 5, the sub-pixels P are located in the display area DA. The intermediate area MA may be located between the opening area OA and the display area DA. The sub-pixels P adjacent to the opening area OA may be spaced apart from each other with the opening area OA disposed therebetween in a plan view. As shown in FIG. 5, the sub-pixels P may be vertically spaced apart from each other with the opening area OA disposed therebetween, or may be laterally spaced apart from each other with the opening area OA disposed therebetween. Because each sub-pixel P uses red, green, or blue light emitted by a light-emitting diode, positions of the sub-pixels P illustrated in FIG. 5 respectively correspond to positions of light-emitting diodes. Accordingly, when the sub-pixels P are spaced apart from one each other with the opening area OA disposed therebetween in a plan view, it may mean that light-emitting diodes are spaced apart from each other with the opening area OA disposed therebetween in a plan view. For example, in a plan view, the light-emitting diodes may be vertically spaced apart from each other with the opening area OA disposed therebetween, or may be laterally spaced apart from each other with the opening area OA disposed therebetween.

Signal lines adjacent to the opening area OA from among signal lines that apply signals to a pixel circuit connected to a light-emitting diode of each sub-pixel P may bypass the opening area OA and/or the opening 10OP. Some data lines DL from among the data lines passing through the display area DA may extend in a ±y direction to apply data signals to the sub-pixels P respectively located above and below the opening area OA, and may bypass in the intermediate area MA along an edge of the opening area OA and/or the opening 10OP.

A bypass portion DL-D1 of at least one of the data lines DL may be formed on a layer different from a layer on which an extending portion DL-L1 crossing the display area DA is located. The bypass portion DL-D1 and the extending portion DL-L1 of the data line DL may be connected to each other through a contact hole CNT. A bypass portion DL-D2 of at least one of the data lines DL may be located on the same layer as a layer on which an extending portion DL-L2 is located, and may be integrally formed with the extending portion DL-L2.

The scan lines SL may be separated or disconnected from each other with the opening area OA disposed therebetween. The scan line SL located on the left of the opening area OA may receive a scan signal from the scan driver 2100 located on the left of the display area DA and the scan line SL located on the right of the opening area OA may receive a scan signal from the scan driver 2100 located on the right of the display area DA as described with reference to FIG. 3.

Grooves G may be located between the opening area OA and an area where the data lines DL bypass in the intermediate area MA. In a plan view, each of the grooves G may have a closed-loop shape completely surrounding the opening area OA, and the grooves G may be spaced apart from one another.

Figure 6:
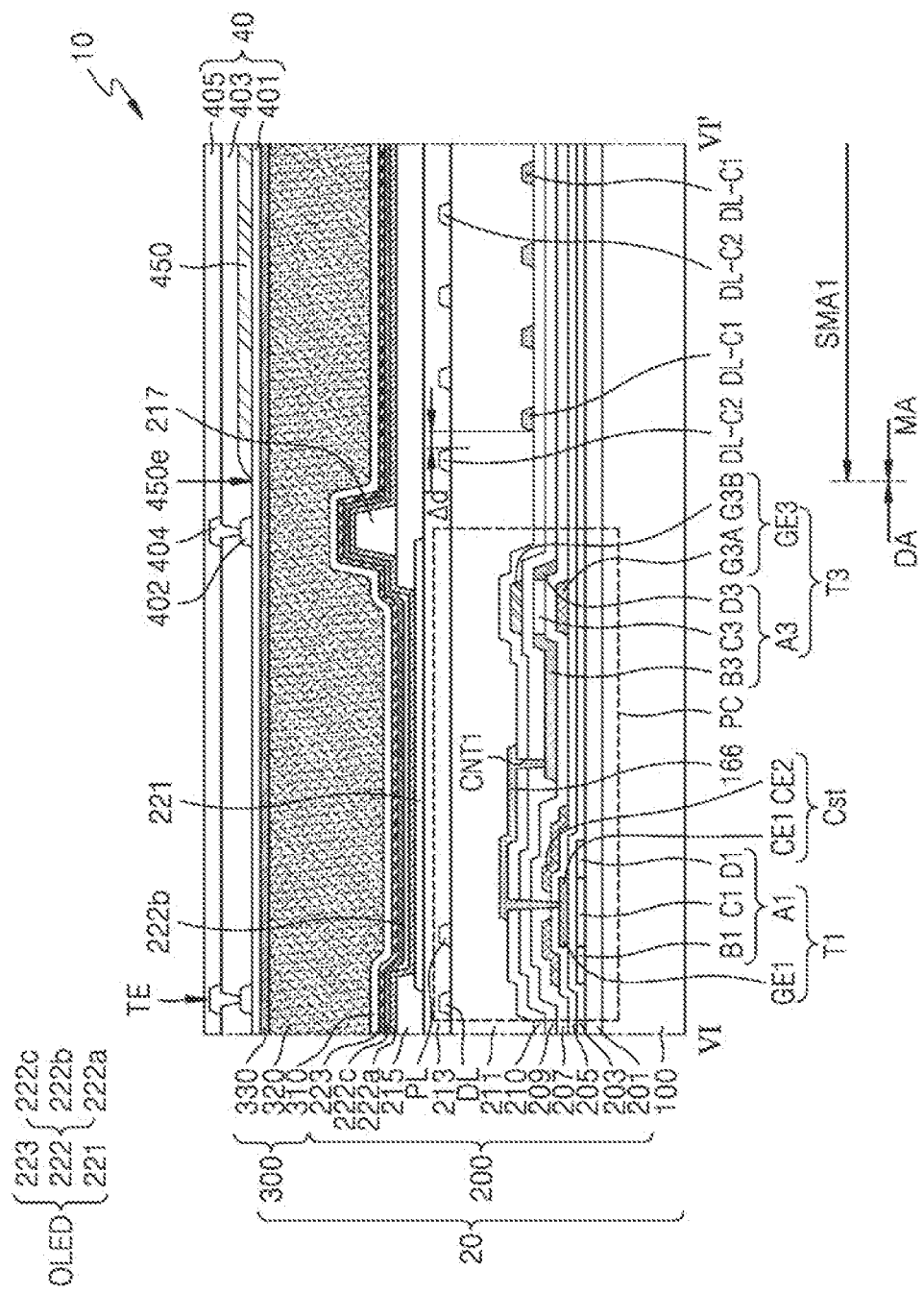
FIG. 6 is a cross-sectional view illustrating a display panel, taken along line VI-VI' of FIG. 5, according to an embodiment.

FIG. 6 is a cross-sectional view illustrating a display panel, taken along line VI-VI' of FIG. 5, according to an embodiment.

Referring to the display area DA of FIG. 6, the substrate 100 may include a glass material or a polymer resin. In an embodiment, the substrate 100 may have a structure in which a base layer including a polymer resin and a barrier layer including an inorganic insulating material such as silicon oxide or silicon nitride are alternately stacked. Examples of the polymer resin may include polyethersulfone, polyarylate, polyetherimide, polyethylene naphthalate, polyethylene terephthalate, polyphenylene sulfide, polyimide, polycarbonate, and cellulose acetate propionate.

The sub-pixel circuit PC may be formed on the substrate 100, and a light-emitting diode, for example, an organic light-emitting diode OLED, may be located on the sub-pixel circuit PC.

Before the sub-pixel circuit PC is formed, a buffer layer 201 may be formed on the substrate 100 to prevent impurities from penetrating into the sub-pixel circuit PC. The buffer layer 201 may include an inorganic insulating material such as silicon nitride, silicon oxynitride, or silicon oxide, and may have a single or multi-layer structure including the above inorganic insulating material.

The sub-pixel circuit PC may include a plurality of transistors and a storage capacitor as described with reference to FIG. 4. In this regard, FIG. 6 illustrates the first transistor T1, the third transistor T3, and the storage capacitor Cst.

The first transistor T1 may include a semiconductor layer (hereinafter, referred to as a first semiconductor layer A1) on the buffer layer 201 and a gate electrode (hereinafter, referred to as a first gate electrode GE1) overlapping a channel region C1 of the first semiconductor layer A1. The first semiconductor layer A1 may include a silicon-based semiconductor material, for example, polysilicon. The first semiconductor layer A1 may include the channel region C1 and a first region B1 and a second region D1 located on both sides of the channel region C1. The first region B1 and the second region D1 are regions having a higher impurity concentration than the channel region C1, and one of the first region B1 and the second region D1 may correspond to a source region and the other may correspond to a drain region.

A first gate insulating layer 203 may be located between the first semiconductor layer A1 and the first gate electrode GE1. The first gate insulating layer 203 may include an inorganic insulating material such as silicon oxide, silicon nitride, or silicon oxynitride, and may have a single or multi-layer structure including the above inorganic insulating material.

The first gate electrode GE1 may include a conductive material including molybdenum (Mo), aluminum (Al), copper (Cu), or titanium (Ti), and may have a single or multi-layer structure including the above material.

The storage capacitor Cst may include a lower electrode CE1 and an upper electrode CE2 overlapping each other. In an embodiment, the lower electrode CE1 of the storage capacitor Cst may include the first gate electrode GE1. In other words, the first gate electrode GE1 may include the lower electrode CE1 of the storage capacitor Cst. For example, the first gate electrode GE1 and the lower electrode CE1 of the storage capacitor Cst may be integrally formed with each other.

A first interlayer insulating layer 205 may be located between the lower electrode CE1 and the upper electrode CE2 of the storage capacitor Cst. The first interlayer insulating layer 205 may include an inorganic insulating material such as silicon oxide, silicon nitride, or silicon oxynitride, and may have a single or multi-layer structure including the above inorganic insulating material.

The upper electrode CE2 of the storage capacitor Cst may include a low-resistance conductive material such as molybdenum (Mo), aluminum (Al), copper (Cu), and/or titanium (Ti), and may have a single or multi-layer structure including the above material.

A second interlayer insulating layer 207 may be located on the storage capacitor Cst. The second interlayer insulating layer 207 may include an inorganic insulating material such as silicon oxide, silicon nitride, or silicon oxynitride, and may have a single or multi-layer structure including the above inorganic insulating material.

A semiconductor layer (hereinafter, referred to as a third semiconductor layer A3) of the third transistor T3 may be located on the second interlayer insulating layer 207. The third semiconductor layer A3 may include an oxide-based semiconductor material. For example, the third semiconductor layer A3 may be formed of a Zn oxide-based material, for example, Zn oxide, In—Zn oxide, or Ga—In—Zn oxide. In some embodiments, the third semiconductor layer A3 may be formed of an In—Ga—Zn—O (IGZO), In—Sn—Zn—O (ITZO), or In—Ga—Sn—Zn—O (IGTZO) semiconductor containing a metal such as indium (In), gallium (Ga), or tin (Sn) in ZnO.

The third semiconductor layer A3 may include a channel region C3 and a first region B3 and a second region D3 located on both sides of the channel region C3. One of the first region B3 and the second region D3 may correspond to a source region and the other may correspond to a drain region.

The third transistor T3 may include a gate electrode (hereinafter, referred to as a third gate electrode GE3) overlapping the channel region C3 of the third semiconductor layer A3. The third gate electrode GE3 may have a dual-gate structure including a lower gate electrode G3A located under the third semiconductor layer A3 and an upper gate electrode G3B located over the channel region C3.

The lower gate electrode G3A may be located on the same layer (e.g., the first interlayer insulating layer 205) as the upper electrode CE2 of the storage capacitor Cst. The lower gate electrode G3A may include the same material as that of the upper electrode CE2 of the storage capacitor Cst.

The upper gate electrode G3B may be located over the third semiconductor layer A3 with a second gate insulating layer 209 disposed therebetween. The second gate insulating layer 209 may include an inorganic insulating material such as silicon oxide, silicon nitride, or silicon oxynitride, and may have a single or multi-layer structure including the above inorganic insulating material.

A third interlayer insulating layer 210 may be located on the upper gate electrode G3B. The third interlayer insulating layer 210 may include an inorganic insulating material such as silicon oxynitride, and may have a single or multi-layer structure including the above inorganic insulating material.

Although the first transistor T1 and the third transistor T3 from among a plurality of transistors described with reference to FIG. 4 are illustrated and the first semiconductor layer A1 and the third semiconductor layer A3 are located on different layers in FIG. 6, the disclosure is not limited thereto.

The second, fifth, sixth, and seventh transistors T2, T5, T6, and T7 (see FIG. 3) described with reference to FIG. 4 may each have the same structure as that of the first transistor T1 described with reference to FIG. 6. For example, each of the second, fifth, sixth, and seventh transistors T2, T5, T6, and T7 (see FIG. 4) may include a semiconductor layer located on the same layer as the first semiconductor layer A1 of the first transistor T1, and a gate electrode located on the same layer as the first gate electrode GE1 of the first transistor T1. The semiconductor layers of the second, fifth, sixth, and seventh transistors T2, T5, T6, and T7 (see FIG. 4) may be integrally connected to the first semiconductor layer A1.

The fourth transistor T4 described with reference to FIG. 4 may have the same structure as that of the third transistor T3 described with reference to FIG. 6. For example, the fourth transistor T4 may include a semiconductor layer located on the same layer as the third semiconductor layer A3 of the third transistor T3, and a gate electrode formed on the same layer as the third gate electrode GE3 of the third transistor T3. The semiconductor layer of the fourth transistor T4 and the third semiconductor layer A3 of the third transistor T3 may be integrally connected to each other.

The first transistor T1 and the third transistor T3 may be electrically connected to each other through a node connection line 166. The node connection line 166 may be located on the third interlayer insulating layer 210. One side of the node connection line 166 may be connected to the first gate electrode GE1 of the first transistor T1, and the other side of the node connection line 166 may be connected to the third semiconductor layer A3 of the third transistor T3.

The node connection line 166 may include aluminum (Al), copper (Cu), and/or titanium (Ti), and may have a single or multi-layer structure including the above material. For example, the node connection line 166 may have a three-layer structure including a titanium layer, an aluminum layer, and a titanium layer.

A first organic insulating layer 211 may be located on the node connection line 166. The first organic insulating layer 211 may include an organic insulating layer. The organic insulating material may include acryl, benzocyclobutene (BCB), polyimide, or hexamethyldisiloxane (HMDSO).

The data line DL and the driving voltage line PL may be located on the first organic insulating layer 211, and may be covered by a second organic insulating layer 213. Each of the data line DL and the driving voltage line PL may include aluminum (Al), copper (Cu), and/or titanium (Ti), and may have a single or multi-layer structure including the above material. For example, each of the data line DL and the driving voltage line PL may have a three-layer structure including a titanium layer, an aluminum layer, and a titanium layer.

The second organic insulating layer 213 may include an organic insulating material such as acryl, BCB, polyimide, and/or HMDSO. Although the data line DL and the driving voltage line PL are formed on the first organic insulating layer 211 in FIG. 6, the disclosure is not limited thereto. In another embodiment, one of the data line DL and the driving voltage line PL may be located on the same layer as the node connection line 166.

The light-emitting diode, for example, the organic light-emitting diode OLED, may be located on the second organic insulating layer 213.

A first electrode 221 of the organic light-emitting diode OLED may include a reflective film including silver (Ag), magnesium (Mg), aluminum (Al), platinum (Pt), palladium (Pd), gold (Au), nickel (Ni), neodymium (Nd), iridium (Jr), chromium (Cr), or a compound thereof. In another embodiment, the first electrode 221 may further include a conductive oxide layer over and/or under the reflective film. The conductive oxide layer may include indium tin oxide (ITO), indium zinc oxide (IZO), zinc oxide (ZnO), indium oxide ($In_2O_3$), indium gallium oxide (IGO), and/or aluminum zinc oxide (AZO). In an embodiment, the first electrode 221 may have a three-layer structure including an ITO layer, an Ag layer, and an ITO layer.

A bank layer 215 may be located on the first electrode 221. The bank layer 215 may have an opening exposing the first electrode 221, and may cover edges of the first electrode 221. The bank layer 215 may include an organic insulating material.

An intermediate layer 222 includes an emission layer 222b. The intermediate layer 222 may include a first functional layer 222a located under the emission layer 222b and/or a second functional layer 222c located over the emission layer 222b. The emission layer 222b may include a high molecular weight organic material or a low molecular weight organic material emitting light of a certain color. The second functional layer 222c may include an electron transport layer (ETL) and/or an electron injection layer (EIL). Each of the first functional layer 222a and the second functional layer 222c may include an organic material.

A second electrode 223 may be formed of a conductive material having a low work function. For example, the second electrode 223 may include a (semi-)transparent layer including silver (Ag), magnesium (Mg), aluminum (Al), platinum (Pt), palladium (Pd), gold (Au), nickel (Ni), neodymium (Nd), iridium (Jr), chromium (Cr), lithium (Li), calcium (Ca), or an alloy thereof. Alternatively, the second electrode 223 may further include a layer formed of ITO, IZO, ZnO, or $In_2O_3$ on the (semi)transparent layer including the above material.

The emission layer 222b may be formed in the display area DA to overlap the first electrode 221 through the opening of the bank layer 215. The first functional layer 222a, the second functional layer 222c, and a second electrode 223 may extend to be located not only in the display area DA but also in the intermediate area MA.

A spacer 217 may be formed on the bank layer 215. The spacer 217 and the bank layer 215 may be formed together in the same process, or may be individually formed in separate processes. In an embodiment, the spacer 217 may include an organic insulating material such as polyimide.

The organic light-emitting diode OLED may be covered by an encapsulation layer 300. The encapsulation layer 300 may include at least one organic encapsulation layer and at least one inorganic encapsulation layer. In an embodiment, in FIG. 6, the encapsulation layer 300 includes first and second inorganic encapsulation layers 310 and 330 and an organic encapsulation layer 320 located between the first and second inorganic encapsulation layers 310 and 330.

Each of the first and second inorganic encapsulation layers 310 and 330 may include at least one inorganic material from among aluminum oxide, titanium oxide, tantalum oxide, hafnium oxide, zinc oxide, silicon oxide, silicon nitride, and silicon oxynitride. Each of the first inorganic encapsulation layer 310 and the second inorganic encapsulation layer 330 may have a single or multi-layer structure including the above material. The organic encapsulation layer 320 may include a polymer-based material. Examples of the polymer-based material may include an acrylic resin, an epoxy resin, polyimide, and polyethylene. In an embodiment, the organic encapsulation layer 320 may include acrylate.

Thicknesses of the first inorganic encapsulation layer 310 and the second inorganic encapsulation layer 330 may be different from each other. A thickness of the first inorganic encapsulation layer 310 may be greater than a thickness of the second inorganic encapsulation layer 330. Alternatively, a thickness of the second inorganic encapsulation layer 330 may be greater than a thickness of the first inorganic encapsulation layer 310, or thicknesses of the first inorganic encapsulation layer 310 and the second inorganic encapsulation layer 330 may be the same.

The display panel 10 may include the image generating layer 20 including the substrate 100, a circuit-diode layer 200 located on the substrate 100 and including pixel circuits and light-emitting diodes, and the encapsulation layer 300, and the input sensing layer 40 on the image generating layer 20.

The input sensing layer 40 may include a first touch insulating layer 401 located on the second inorganic encapsulation layer 330, a first conductive layer 402 disposed on the first touch insulating layer 401, a second touch insulating layer 403 disposed on the first conductive layer 402, a second conductive layer 404 disposed on the second touch insulating layer 403, and a third touch insulating layer 405 disposed on the second conductive layer 404.

Each of the first touch insulating layer 401, the second touch insulating layer 403, and the third touch insulating layer 405 may include an inorganic insulating layer and/or an organic insulating layer. In an embodiment, each of the first touch insulating layer 401 and the second touch insulating layer 403 may include an inorganic insulating material such as silicon oxide, silicon nitride, and/or silicon oxynitride, and the third touch insulating layer 405 may include an organic insulating material.

A touch electrode TE of the input sensing layer 40 may have a structure in which the first conductive line 402 and the second conductive line 404 are connected to each other. Alternatively, the touch electrode TE may be formed on any one of the first conductive line 402 and the second conductive line 404, and may include a metal line provided on the conductive layer. Each of the first conductive line 402 and the second conductive line 404 may include aluminum (Al), copper (Cu), and/or titanium (Ti), and may have a single or multi-layer structure including the above material. For example, each of the first conductive line 402 and the second conductive line 404 may have a three-layer structure including a titanium layer, an aluminum layer, and a titanium layer.

The intermediate area MA illustrated in FIG. 6 may include a first sub-intermediate area SMA1 in which the bypass portions DL-C1 and DL-C2 of the data lines DL described with reference to FIG. 5 is disposed.

The bypass portions DL-C1 and DL-C2 of the data lines DL may be located on different layers. Any one of the bypass portions DL-C1 and DL-C2 of neighboring data lines DL may be located on the third interlayer insulating layer 210 and the other may be located on the first organic insulating layer 211.

When the bypass portions DL-C1 and DL-C2 of the data lines DL are alternately located with an insulating layer (e.g., the first planarization insulating layer 211) disposed therebetween, a distance (Δd) between adjacent bypass portions DL-C1 and DL-C2 of the data lines DL may be reduced, thereby efficiently utilizing the area in the intermediate area MA.

Figure 7:
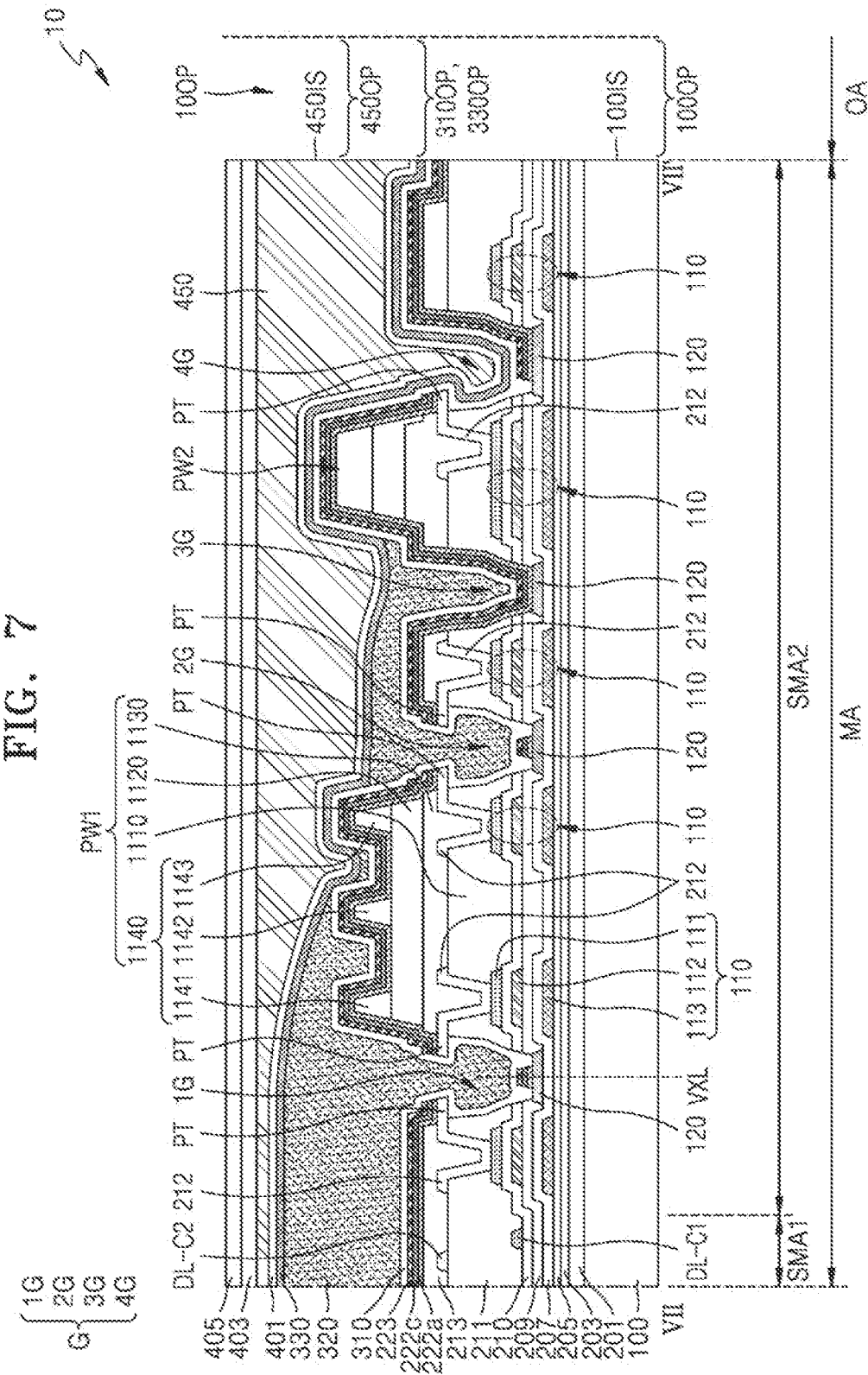
FIG. 7 is a cross-sectional view illustrating a display panel, taken along line VII-VII' of FIG. 5, according to an embodiment.

FIG. 7 is a cross-sectional view illustrating a display panel, taken along line VII-VII' of FIG. 5, according to an embodiment.

Referring to FIGS. 6 and 7, the intermediate area MA may include the first sub-intermediate area SMA1 disposed adjacent to the display area DA (see FIG. 6) and a second sub-intermediate area SMA2 disposed adjacent to the opening area OA. The bypass portions DL-C1 and DL-C2 of the data lines DL described with reference of FIG. 6 are located in the first sub-intermediate area SMA1, and the bypass portions DL-C1 and DL-C2 of the data lines DL in the first sub-intermediate area SMA1 of FIG. 7 correspond to bypass portions of some of the data lines described with reference to FIG. 6.

The bypass portions DL-C1 and DL-C2 of the data lines DL may be located in the first sub-intermediate area SMA1 of FIG. 7, the grooves G and partition walls may be located in the second sub-intermediate area SMA2, and the encapsulation layer 300 may extend to the intermediate area MA and may cover the grooves G and the partition walls.

Referring to the second sub-intermediate area SMA2 of FIG. 7, the grooves G may be spaced apart from one another. In this regard, in FIG. 7, first through fourth grooves 1G, 2G, 3G, and 4G are arranged from the first sub-intermediate area SMA1 toward the opening area OA. Each of the first through fourth grooves 1G, 2G, 3G, and 4G may have a closed-loop shape completely surrounding the opening area OA in a plan view as described with reference to FIG. 5.

The groove G may pass through at least one insulating layer formed on the buffer layer 201. The at least one insulating layer in which the groove G is formed may include the first organic insulating layer 211, and may further include insulating layers under the first organic insulating layer 211. In this regard, in FIG. 7, the first through fourth grooves 1G, 2G, 3G, and 4G pass through the second gate insulating layer 209, the third interlayer insulating layer 210, and the first organic insulating layer 211.

A lower layer 120 is disposed in an area corresponding to the groove G. The lower layer 120 may function as an etch stopper during an etching process for forming the groove G. Accordingly, a top surface of the lower layer 120 is exposed by the groove G, thus a bottom surface of the groove G may be a top surface of the lower layer 120. In this regard, in FIG. 7, the lower layer 120 is located under each of the first through fourth grooves 1G, 2G, 3G, and 4G, and a bottom surface of each of the first through fourth grooves 1G, 2G, 3G, and 4G is on the same plane as a top surface of the lower layer 120.

The lower layer 120 may be located on the second interlayer insulating layer 207, and may be formed in the same process as the third semiconductor layer A3 described with reference to FIG. 6. The lower layer 120 may include the same material as that of the third semiconductor layer A3, e.g., oxide-based semiconductor material. Like the groove G, the lower layer 120 may have a closed-loop shape surrounding the opening area OA in a plan view.

When the groove G is formed on at least one inorganic insulating layer instead of being formed on the substrate 100 as in an embodiment, moisture which may be introduced through the substrate 100 may be blocked by the at least one inorganic insulating layer. In this regard, in FIG. 7, the groove G may be formed on the buffer layer 201, the first gate insulating layer 203, and the first interlayer insulating layer 205, and thus, the buffer layer 201, the first gate insulating layer 203, and the first interlayer insulating layer 205 may effectively block moisture from being introduced through the substrate 100.

A metal pattern layer 212 including a tip PT may be located on at least one of both sides of the groove G. For example, the metal pattern layers 212 may be located on both sides of the first groove 1G, and each metal pattern layer 212 may include the tip PT extending toward the center of the first groove 1G. The metal pattern layers 212 may be located on both sides of the second groove 2G, and each metal pattern layer 212 may include the tip PT extending toward the center of the second groove 2G. The metal pattern layer 212 may be located on any one of both sides of the fourth groove 4G, and the metal pattern layer 212 may include the tip PT extending toward the center of the fourth groove 4G.

The metal pattern layer 212 may include the same metal as that of the data line DL and/or the driving voltage line PL described with reference to FIG. 6. In an embodiment, the metal pattern layer 212 may have a three-layer structure including a titanium layer, an aluminum layer, and a titanium layer.

The metal pattern layer 212 may be located on at least one side of the groove G. For example, the metal pattern layers 212 may be located on both sides of the first groove 1G with respect to a virtual vertical line VXL crossing the center of the first groove 1G, and an end portion of each metal pattern layer 212 may protrude toward the center of the first groove 1G to form the tip PT. The first groove 1G may have undercut portions formed under the tip PT.

Likewise, the metal pattern layers 212 may be located on both sides of the second groove 2G, and an end portion of each metal pattern layer 212 may protrude toward the center of the second groove 2G to form the tip PT.

The metal pattern layer 212 may be located on a side of the fourth groove 4G, for example, a side adjacent to a second partition wall PW2, and an end portion of the metal pattern layer 212 may protrude toward the center of the fourth groove 4G to form the tip PT.

Some of layers included in the organic light-emitting diode OLED, for example, the first and second functional layers 222a and 222c which are organic layers, may be disconnected in a region corresponding to the groove G. The second electrode 223 may also be disconnected or separated in the region corresponding to the groove G.

In this regard, in FIG. 7, the first and second functional layers 222a and 222c and the second electrode 223 are disconnected and separated in regions corresponding to the first groove 1G, the second groove 2G, the fourth groove 4G. Moisture may travel toward the display area DA (see FIG. 5) through a side surface of the opening 10OP of the display panel 10. Organic layers that are continuously formed, that is, the first and second functional layers 222a and 222c, may serve as a passage through which the moisture travels. However, because the first and second functional layers 222a and 222c are disconnected in the region corresponding to the groove G as shown in FIG. 7, moisture may be prevented from traveling toward the display area DA (see FIG. 5).

A metal dummy stack 110 may be located around the groove G. For example, metal dummy stacks 110 may be located on both sides of the groove G. The metal dummy stack 110 may be a kind of a mound and may increase a depth of the groove G. In an embodiment, in FIG. 7, the metal dummy stack 110 includes three metal layers, for example, first through third metal layers 111, 112, and 113, overlapping one another with an insulating layer disposed therebetween.

The first through third metal layers 111, 112, and 113 may be located on the same layers and may include the same materials as electrodes of the storage capacitor and the transistors described with reference to FIG. 6. For example, the first metal layer 111 may be located on the same layer and may include the same material as the connection node line 166 (see FIG. 6). The second metal layer 112 may be located on the same layer and may include the same material as the upper gate electrode G3B that is a sub-layer of the third gate electrode GE3. The third metal layer 113 may be located on the same layer and may include the same material as the lower gate electrode G3A that is a sub-layer of the third gate electrode GE3 and/or the upper electrode CE2 of the storage capacitor. Although the metal dummy stack 110 includes three metal layers overlapping one another with an insulating layer disposed therebetween in FIG. 7, the disclosure is not limited thereto. In another embodiment, the number of metal layers of the metal dummy stack 110 may be less or greater than 3.

The metal pattern layer 212 including the tip PT may not be located around some of the grooves G, for example, around the third groove 3G. The third groove 3G may be used to monitor a position of the organic encapsulation layer 320 of the encapsulation layer 300 during a process of the display panel 10.

The organic encapsulation layer 320 may be formed by applying a monomer and then curing the monomer. Because the monomer is fluidic, controlling the position of the monomer is one of important factors in manufacturing the display panel 10. A position of the organic encapsulation layer 320 may be measured by using an amount of light reflected from the display panel among light incident on the display panel. Because the tip PT including metal affects a reflectance of light used to monitor the organic encapsulation layer 320, when all of the grooves G include the tips PT, it is difficult to trace the position of the organic encapsulation layer 320. However, the display panel according to an embodiment may include the third groove 3G not including the tip PT and/or the fourth groove 4G including the tip PT only on one side, thereby preventing or minimizing the above problem.

The partition walls in addition to the grooves G may be located in the intermediate area MA. In this regard, FIG. 7 illustrates a first partition wall PW1 and the second partition wall PW2. The grooves G may be spaced apart from one another in the second sub-intermediate area SMA2. The first groove 1G may be located between the first partition wall PW1 and the first sub-intermediate area SMA1. In other words, the first groove 1G may be located between the first partition wall PW1 and the display area DA (see FIG. 5). The second groove 2G and the third groove 3G may be located between the first partition wall PW1 and the second partition wall PW2, and the fourth groove 4G may be located between the second partition wall PW2 and the opening area OA.

The groove G between the first partition wall PW1 and the second partition wall PW2 may be covered by the organic encapsulation layer 320. In this regard, in FIG. 7, the second groove 2G and the third groove 3G are covered by the organic encapsulation layer 320 between the first partition wall PW1 and the second partition wall PW2.

The first inorganic encapsulation layer 310 of the encapsulation layer 300 may continuously cover inner surfaces of the grooves G, and the organic encapsulation layer 320 may cover the first sub-intermediate area SMA1 and may cover a part of the second sub-intermediate area SMA2. The organic encapsulation layer 320 may cover some of the grooves G, for example, the first groove 1G, and the second and third grooves 2G and 3G disposed between the first partition wall PW1 and the second partition wall PW2. The second inorganic encapsulation layer 330 may entirely cover the intermediate area MA on the organic encapsulation layer 320.

The first partition wall PW1 may include a plurality of protrusions to control the flow of a monomer when the organic encapsulation layer 320 is formed. In an embodiment, in FIG. 7, the first partition wall PW1 includes first through third protrusions 1141, 1142, and 1143 which are spaced apart from one another.

In the intermediate area MA, the organic encapsulation layer 320 may be discontinuous due to a structure of the first partition wall PW1. For example, a part of the organic encapsulation layer 320 may cover the display area DA and the first sub-intermediate area SMA1 as shown in FIGS. 6 and 7, and another part may cover a portion between the first partition wall PW1 and the second partition wall PW2. A part of the second inorganic encapsulation layer 330 disposed on the third protrusion 1143 of the first partition wall PW1 at which the organic encapsulation layer 320 is discontinuous may directly contact a part of the first inorganic encapsulation layer 310.

An end portion of the organic encapsulation layer 320 may be located on a side of the second partition wall PW2, and does not extend toward the opening area OA through the second partition wall PW2. Accordingly, a part of the second inorganic encapsulation layer 330 may directly contact a part of the first inorganic encapsulation layer 310 on a top surface of the second partition wall PW2. The second inorganic encapsulation layer 330 may directly contact the first inorganic encapsulation layer 310 between the second partition wall PW2 and the opening area OA.

Touch insulating layers described with reference to FIG. 6 may extend to the intermediate area MA. In this regard, in FIG. 7, the first through third touch insulating layers 401, 403, and 405 extend to the intermediate area MA.

A planarization layer 450 may be located in the intermediate area MA. The planarization layer 450 may planarize the intermediate area MA. The planarization layer 450 may be located in the intermediate area MA and may cover a structure provided under the planarization layer 450.

Referring to FIGS. 6 and 7, the planarization layer 450 may be located only in the intermediate area MA, and may not be in the display area DA (see FIG. 6). In this regard, in FIG. 6, an outer edge 450e of the planarization layer 450 is not located in the display area DA. A process of forming the planarization layer 450 may be performed between a process of forming the first touch insulating layer 404 and a process of forming the second touch insulating layer 403. Accordingly, in the display area DA adjacent to the outer edge 450e of the planarization layer 450, the first touch insulating layer 401 and the second touch insulating layer 403 may directly contact each other.

Referring to the opening area OA of FIG. 7, the display panel 10 includes the opening 10OP. The opening 10OP of the display panel 10 may include openings of elements constituting the display panel 10. For example, the opening 10OP of the display panel 10 may include an opening 100OP of the substrate 100, openings 310OP and 3300P of the first and second inorganic encapsulation layers 310 and 330 from among the encapsulation layers 300, and an opening 450OP of the planarization layer 450.

The openings of the elements constituting the display panel 10 may be simultaneously formed. Accordingly, an inner surface 100IS of the substrate 100 defining the opening 1000P of the substrate 100 and an inner surface 45015 of the planarization layer 450 defining the opening 450OP of the planarization layer 450 may be located on the same vertical line.

FIGS. 8 through 11 are cross-sectional views illustrating a process of manufacturing a display panel according to an embodiment. FIGS. 8 through 11 are cross-sectional views illustrating the intermediate area MA and the opening area OA according to the process of manufacturing the display panel.

Figure 8:
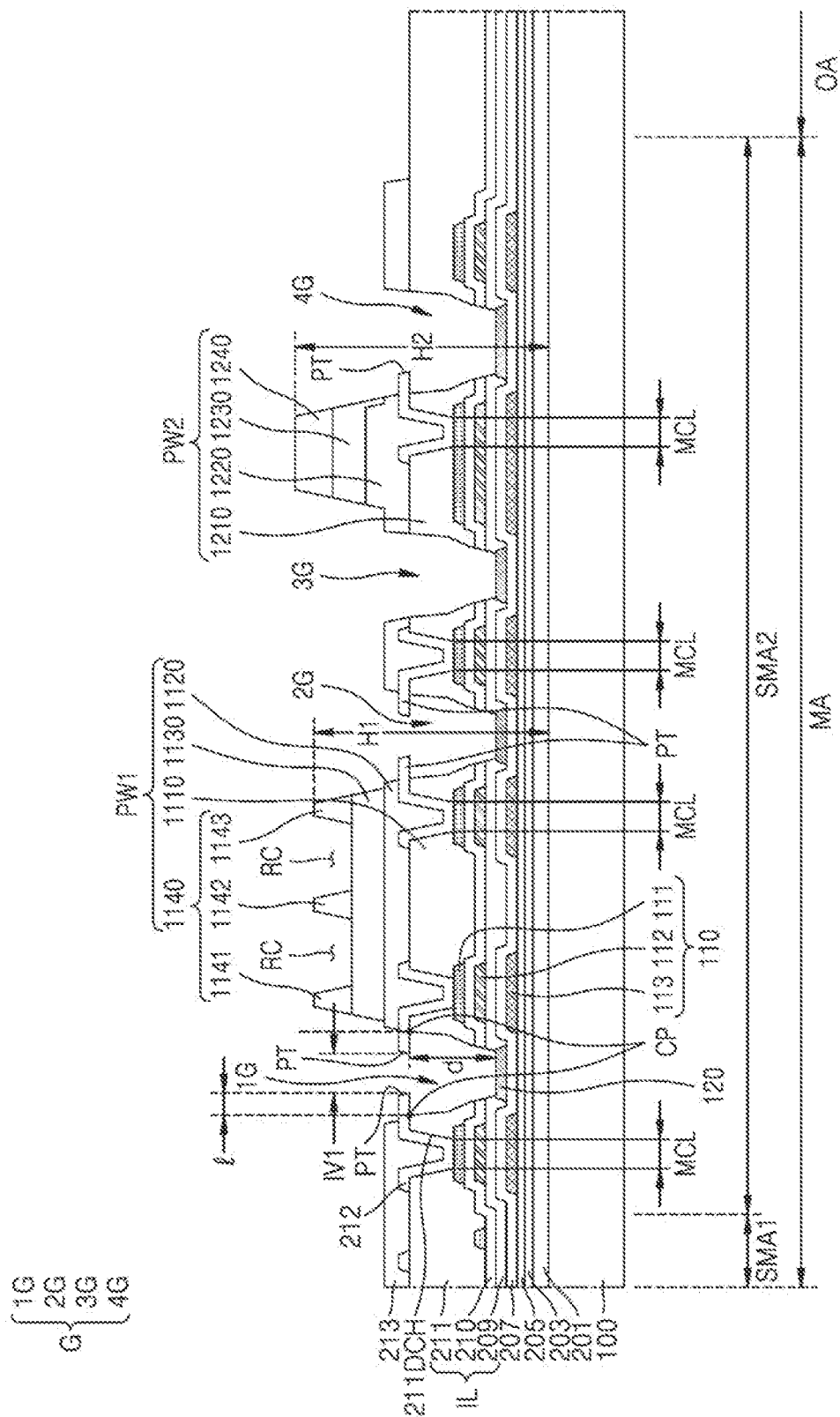
FIGS. 8, 9, 10 and 11 are cross-sectional views illustrating a process of manufacturing a display panel, according to an embodiment.

Referring to FIG. 8, the first through fourth grooves 1G, 2G, 3G, and 4G and the first and second partition walls PW1 and PW2 may be formed in the intermediate area MA, for example, in the second sub-intermediate area SMA2.

The first through fourth grooves 1G, 2G, 3G, and 4G may be formed by removing at least one insulating layer. For example, the first through fourth grooves 1G, 2G, 3G, and 4G may be formed by removing an insulating layer stack IL including the second gate insulating layer 209, the third interlayer insulating layer 210, and the first organic insulating layer 211. The first through fourth grooves 1G, 2G, 3G, and 4G may be formed by removing portions of the first organic insulating layer 211, the third interlayer insulating layer 210, and the second ate insulating layer 209, and in this case, the lower layer 120 may functions as an etch stopper. Bottom surfaces of the first through fourth grooves 1G, 2G, 3G, and 4G may correspond to a top surface of the lower layer 120.

The metal pattern layer 212 including the tip PT may be located around some of the grooves, for example, the first groove 1G, the second groove 2G, and the fourth groove 4G. The tip PT that is an end portion of the metal pattern layer 212 directly located on the first organic insulating layer 211 may protrude toward the center of a corresponding groove.

The first groove 1G may have an undercut portion at which a side surface of the first organic insulating layer 211 and a bottom surface of the metal pattern layer 212 meet each other at a point CP. The tip PT of the metal pattern layer 212 may protrude toward the center of the first groove 1G by a first length 13. The first length 13 of the tip PT may be less than a depth d of the groove described below. In an embodiment, the first length 13 of the tip PT may be less than 2 μm.

Like the first groove 1G, the tips PT of the metal pattern layers 212 may be located on both sides of the second groove 2G. The tip PT of the metal pattern layer 212 may be located on one side of the fourth groove 4G.

The metal dummy stack 110 may be located around the first through fourth grooves 1G, 2G, 3G, and 4G. The metal dummy stacks 110 may be located on both sides of the virtual vertical line VXL (see FIG. 7) passing through a center of each of the first through fourth grooves 1G, 2G, 3G, and 4G. When the metal dummy stack 110 that is a mound including metal layers overlapping one another with an insulating layer disposed therebetween is located, the depth d of each of the first through fourth grooves 1G, 2G, 3G, and 4G may be increased. The depth d may be greater than the first length 13 of the tip PT and range from about 2.5 μm to about 3 μm.

The metal dummy stack 110 may include the first through third metal layers 111, 112, and 113, and materials of the first through third metal layers 111, 112, and 113 are the same as those descried with reference to FIG. 7.

The metal pattern layer 212 may directly contact an uppermost layer of the metal dummy stack 110, for example, the first metal layer 111. The metal pattern layer 212 may directly contact a top surface of the first metal layer 111 through a dummy contact hole 211DCH of the first organic insulating layer 211. A metal contact area MCL in which the metal pattern layer 212 and the metal dummy stack 110 directly contact each other may be located adjacent to each of the grooves. For example, the metal contact areas MCL may be located on both sides of the first and second grooves 1G and 2G, and the metal contact area MCL may be located on one side of each of the third and fourth grooves 3G and 4G. As such, at least one metal contact area MCL may be located between neighboring grooves. When the metal pattern layer 212 is formed to cover a thickness direction of the first organic insulating layer 211, moisture may be prevented from penetrating through the first organic insulating layer 211.

The first partition wall PW1 may be located between the first groove 1G and the second groove 2G. The first partition wall PW1 may include first through fourth sub-partition wall layers 1110, 1120, 1130, and 1140. The first through fourth sub-partition wall layers 1110, 1120, 1130 and 1140 may respectively include the same materials as those of the first organic insulating layer 211, the second organic insulating layer 213, the bank layer 215, and the spacer 217.

The fourth sub-partition wall 1140 may include a plurality of protrusions in an embodiment, in this regard FIG. 8 illustrates first through third protrusions 1141, 1142, and 1143. The first through third protrusions 1141, 1142, and 1143 may be formed on the third sub-partition wall layer 1130, and thus, the first through third protrusions 1141, 1142, and 1143 may include the same material as that of the spacer 217.

Each recess RC may be formed between adjacent protrusions. A depth of each recess RC may correspond to a height of each of the first through third protrusions 1141, 1142, and 1143. A structure including the first through third protrusions 1141, 1142, and 1143 and the recesses RC may control the flow of a monomer of an organic encapsulation layer in a process described below.

The second partition wall PW2 may be spaced apart from the first partition wall PW1, and may be located between the first partition wall PW1 and the opening area OA. The second partition wall PW2 may include first through fourth sub-partition wall layers 1210, 1220, 1230, and 1240. The first through fourth sub-partition wall layers 1210, 1220, 1230, and 1240 may respectively include the same materials as those of the first organic insulating layer 211, the second organic insulating layer 213, the bank layer 215, and the spacer 217.

The second partition wall PW2 may be located on the metal dummy stack 110 to overlap the metal dummy stack 110. A height H2 of the second partition wall PW2 may be equal to or greater than a height H1 of the first partition wall PW1. In an embodiment, in FIG. 8, the height H2 of the second partition wall PW2 is greater than the height H1 of the first partition wall PW1. Each of the first partition wall PW1 and the second partition wall PW2 may have a closed-loop shape entirely surrounding the opening area OA in a plan view. Because the first partition wall PW1 has a closed-loop shape entirely surrounding the opening area OA in a plan view, each of the first through third protrusions 1141, 1142, and 1143 may also have a closed-loop shape entirely surrounding the opening area OA in a plan view.

Figure 9:
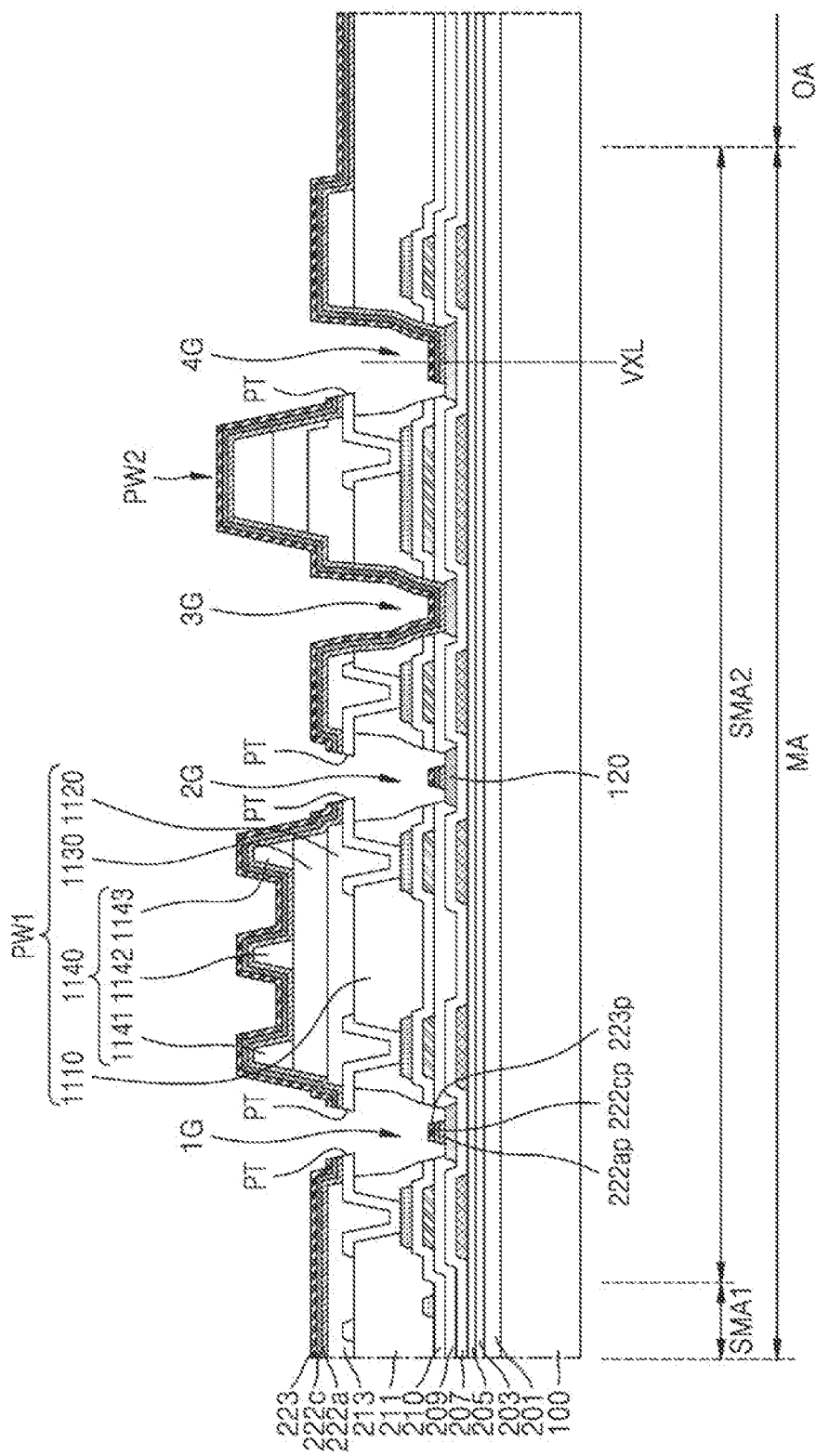

Referring to FIG. 9, the first and second functional layers 222a and 222c and the second electrode 223 of the organic light-emitting diode may be formed on the substrate 100 on which the first through fourth grooves 1G, 2G, 3G, and 4G, the metal pattern layer 212, and the first and second partition walls PW1 and PW2 are formed. The first and second functional layers 222a and 222c and the second electrode 223 may be formed by using a thermal evaporation method. As described with reference to FIG. 6, the first and second functional layers 222a and 222c and the second electrode 223 may also be deposited on the lower layer 120 in the intermediate area MA. However, each of the first and second functional layers 222a and 222c and the second electrode 223 may be disconnected because the first groove 1G, the second groove 2G, and the fourth groove 4G each have a undercut portion under the tip PT of the metal pattern layer 212 in the intermediate area MA. The undercut portion may be formed in the second gate insulating layer 209, the third interlayer insulating layer 210 and the first organic insulating layer 211.

In this regard, in FIG. 9, when the first functional layer 222a located on the tip PT is disconnected and separated, a portion 222ap of the first functional layer 222a is located on a bottom surface of each of the first groove 1G and the second groove 2G. Likewise, when the second functional layer 222c located on the tip PT is disconnected and separated, a portion 222cp of the second functional layer 222c and a portion 223c of the second electrode 223 are located on a bottom surface of each of the first groove 1G and the second groove 2G.

Because the metal pattern layer 212 including the tip PT is not located around the third groove 3G, the first and second functional layers 222a and 222c and the second electrode 223 may continuously cover an inner surface of the third groove 3G.

Figure 10:
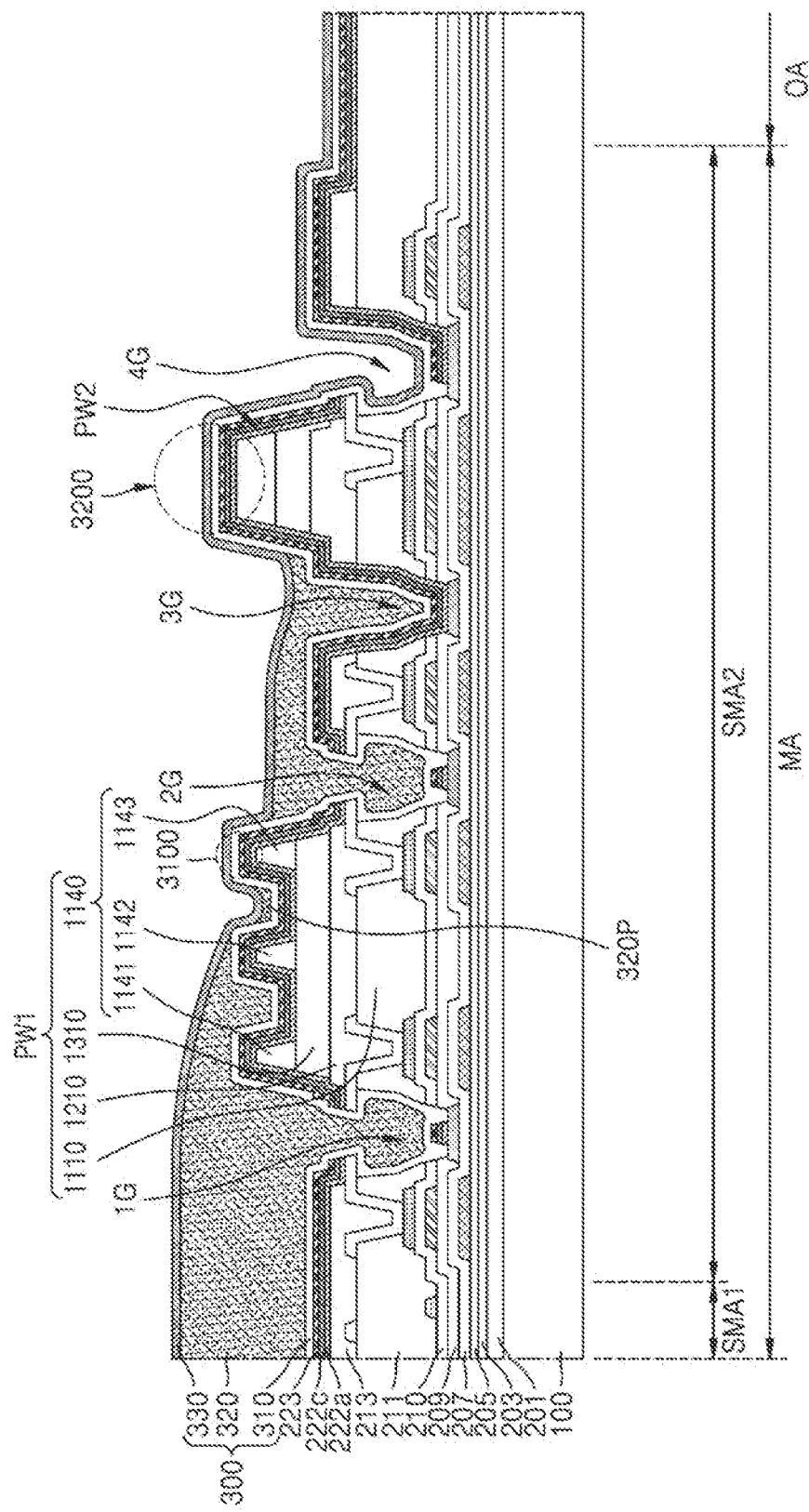

Referring to FIG. 10, the encapsulation layer 300 may be formed. The first inorganic encapsulation layer 310 may be formed by using a chemical vapor deposition method. Because the first inorganic encapsulation layer 310 has relatively excellent step coverage, the first inorganic encapsulation layer 310 may continuously cover inner surfaces of the first through fourth grooves 1G, 2G, 3G, and 4G and may continuously cover a bottom surface of the tip PT. The first inorganic encapsulation layer 310 may continuously cover a side surface and a top surface of the first partition wall PW1 and may continuously cover a side surface and a top surface of the second partition wall PW2.

Next, the organic encapsulation layer 320 may be formed by applying and then curing a monomer. The monomer may be applied by using an inkjet method. The monomer may be applied so that a part of the monomer exists between the first partition wall PW1 and the second partition wall PW2, and the flow of the monomer may be controlled by the first through third protrusions 1141, 1142, and 1143 formed in the first partition wall PW1. The monomer may exist in the recess RC (see FIG. 8) between neighboring protrusions from among the first through third protrusions 1141, 1142, and 1143, and a portion 320P of the organic encapsulation layer 320 may be located in the recess RC (see FIG. 8) when the monomer in the recess RC is cured.

When the amount of the monomer in the recess RC (see FIG. 8) exceeds an acceptable limit of the recess RC (see FIG. 8), the monomer may overflow the first partition wall PW1 and fill the second groove 2G and/or the third groove 3G. Accordingly, because the monomer has a viscosity lower enough not to exist on a top surface of a protrusion of the first partition wall PW1 disposed close to the second partition wall PW2, for example, the third protrusion 1143, there is no monomer disposed on the third protrusion 1143. Accordingly, a part of the second inorganic encapsulation layer 330 may directly contact a part of the first inorganic encapsulation layer 310 on the first partition wall PW1, for example, on the third protrusion 1143. In this regard, in FIG. 10, an inorganic contact area (hereinafter, a first inorganic contact area 3100) where a part of the second inorganic encapsulation layer 330 and a part of the first inorganic encapsulation layer 310 directly contact each other on the first partition wall PW1 may formed.

An organic contact area formed when the second inorganic encapsulation layer 330 and the first inorganic encapsulation layer 310 directly contact each other may also exist on the second partition wall PW2. The organic encapsulation layer 320 does not extend toward the opening area OA through the second partition wall PW2, and a second inorganic contact area 3200 may be formed when a part of the second inorganic encapsulation layer 330 and a part of the first inorganic encapsulation layer 310 directly contact each other on a top surface of the second partition wall PW2.

A portion of the organic encapsulation layer 320 may exist in each of the first groove 1G, the second groove 2G, and the third groove 3G. The organic encapsulation layer 320 does not exist in the fourth groove 4G closer to the opening area OA than the second partition wall PW2, and the second inorganic encapsulation layer 330 may directly contact the first inorganic encapsulation layer 310 on an inner surface of the fourth groove 4G.

Figure 11:
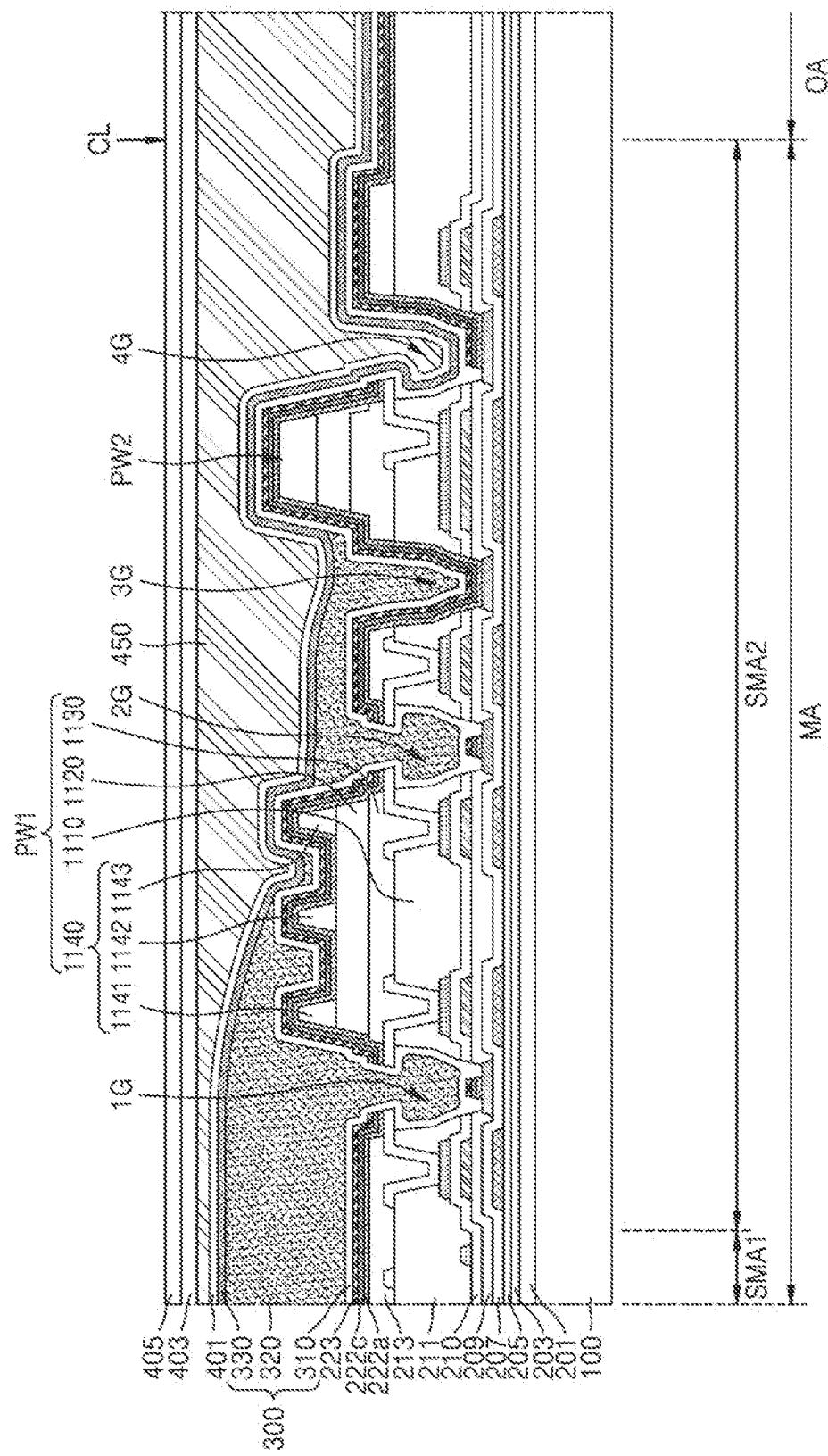

Referring to FIG. 11, the first touch insulating layer 401, the planarization layer 450, the second touch insulating layer 403, and the third touch insulating layer 405 may be formed on the encapsulation layer 300. A part of the planarization layer 450 may exist in the fourth groove 4G. Although not shown in FIG. 11, the first conductive layer 402 (see FIG. 6) may be formed between the first touch insulating layer 401 and the second touch insulating layer 403, and the second conductive layer 404 (see FIG. 6) may be formed between the second touch insulating layer 403 and the third touch insulating layer 405.

Next, when elements located in the opening area OA are removed along a cutting line CL by using a laser beam or the like, the opening 10OP of the display panel 10 may be formed in the opening area OA as shown in FIG. 7.

Figure 12A:
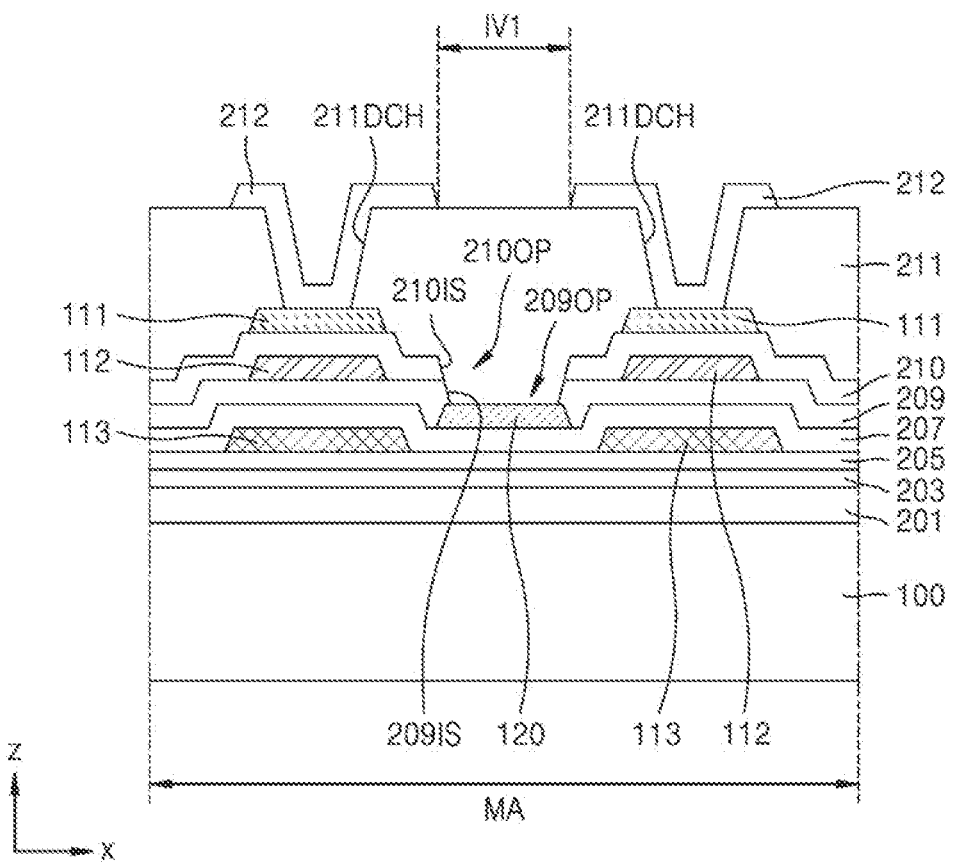
FIGS. 12A, 12B and 12C are cross-sectional views illustrating a process of forming a structure of a groove and a tip of a display panel, according to an embodiment.
Figure 12B:
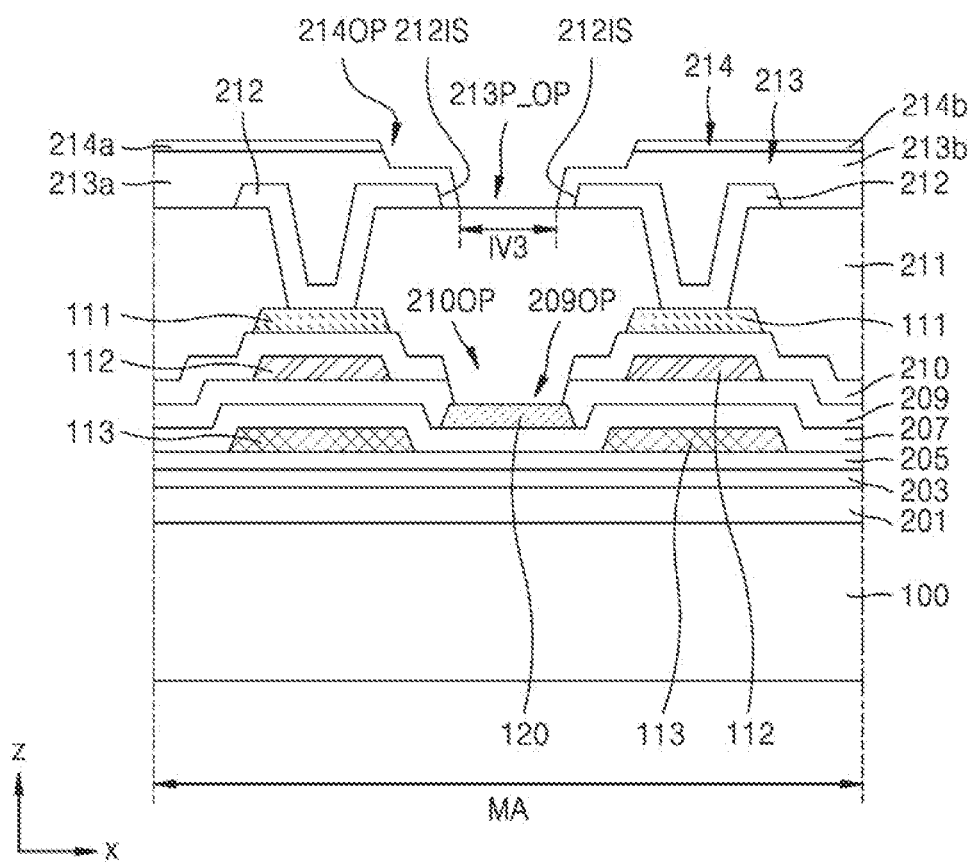
Figure 12C:
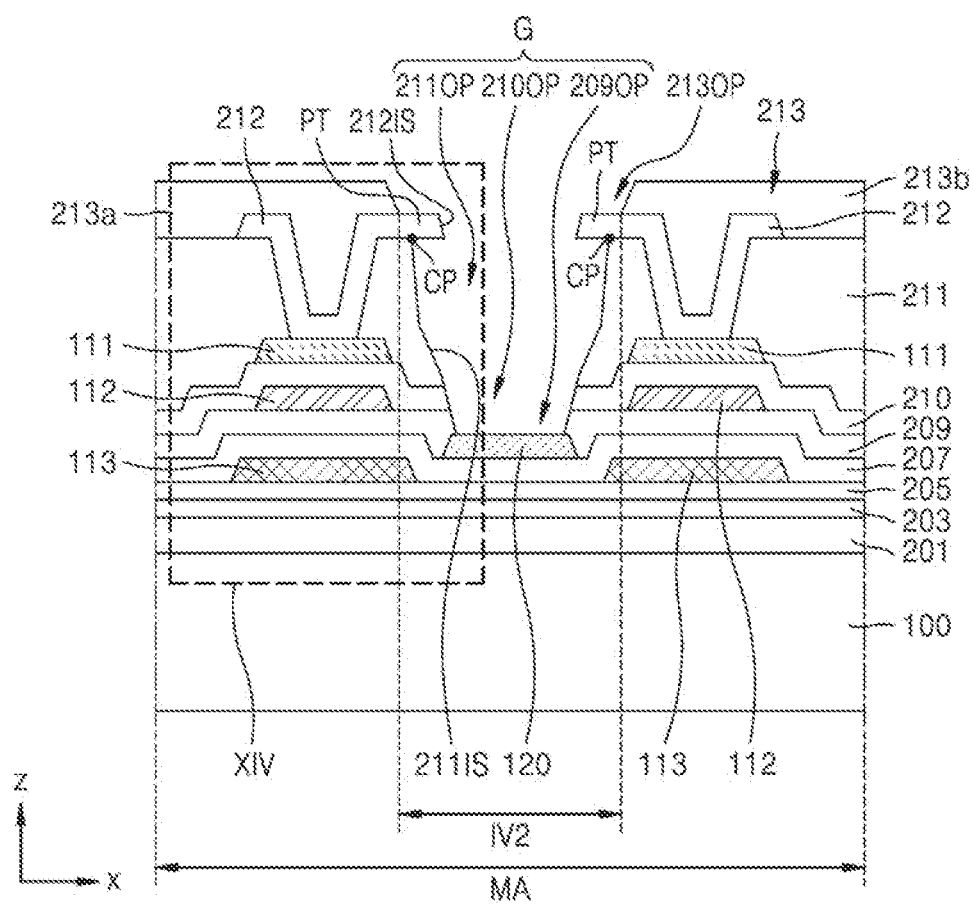

FIGS. 12A through 12C are cross-sectional views illustrating a process of forming a structure of a groove and a tip of a display panel, according to an embodiment. A structure of a groove and a tip of FIG. 8 may be formed by using a process of FIGS. 12A through 12C.

Referring to FIG. 12A, the metal pattern layer 212 is formed in the intermediate area MA that is a third area. The metal pattern layer 212 is formed on the first organic insulating layer 211. Before the metal pattern layer 212 is formed on the first organic insulating layer 211, a plurality of layers may be formed on the substrate 100. In this regard, FIG. 12A illustrates insulating layers, metal layers, and a lower layer formed on the substrate 100.

The insulating layers on the substrate 100 may include inorganic insulating layers, and the inorganic insulating layers may include the buffer layer 201, the first gate insulating layer 203, the first interlayer insulating layer 205, the second interlayer insulating layer 207, the second gate insulating layer 209, and the third interlayer insulating layer 210.

The metal layers on the substrate 100 may include the first metal layer 111, the second metal layer 112 disposed under the first metal layer 111, and the third metal layer 113 disposed under the second metal layer 112.

The third metal layer 113 may be formed between the first interlayer insulating layer 205 and the second interlayer insulating layer 207, and may be formed together in the same process as the lower gate electrode G3A that is a sub-layer of the third gate electrode GE3 and/or the upper electrode CE2 of the storage capacitor Cst described with reference to FIG. 6.

Adjacent third metal layers 113 may be spaced apart from each other. For example, two adjacent third metal layers 113 may be spaced apart from each other with the lower layer 120 disposed therebetween. In other words, two adjacent third metal layers 113 may be located on both sides of the lower layer 120. The lower layer 120 may be located on the second interlayer insulating layer 207. The lower layer 120 may be formed together in the same process as the third semiconductor layer A3 described with reference to FIG. 6.

The second gate insulating layer 209 and the third interlayer insulating layer 210 may be formed on the lower layer 120, and the second gate insulating layer 209 and the third interlayer insulating layer 210 may respectively include openings 2090P and 210OP overlapping the lower layer 120. The openings 2090P and 210OP of the second gate insulating layer 209 and the third interlayer insulating layer 210 may overlap each other. A side surface 209IS of the second gate insulating layer 209 and a side surface 210IS of the third interlayer insulating layer 210 defining the openings 2090P and 210OP may be disposed on substantially the same plane. When the side surface 209IS of the second gate insulating layer 209 and the side surface 210IS of the third interlayer insulating layer 210 are dispose on substantially the same plane, it may mean that the side surface 209IS of the second gate insulating layer 209 and the side surface 210IS of the third interlayer insulating layer 210 do not have a step difference.

The opening 2090P of the second gate insulating layer 209 and the opening 210OP of the third interlayer insulating layer 210 may be formed together in the same process. For example, the opening 2090P of the second gate insulating layer 209 and the opening 210OP of the third interlayer insulating layer 210 may be formed together in a process of forming a first contact hole CNT1 (see FIG. 6) for connection between the node connection line 166 and the third semiconductor layer A3 described with reference to FIG. 6.

The second metal layer 112 may be located between the second gate insulating layer 209 and the third interlayer insulating layer 210, and may be formed together in the same process as the upper gate electrode G3B that is a sub-layer of the third gate electrode GE3 described with reference to FIG. 6.

Adjacent second metal layers 112 may be spaced apart from each other. For example, two adjacent second metal layers 112 may be spaced apart from each other with the lower layer 120 disposed therebetween. In other words, two adjacent second metal layers 112 may be located on both sides of the lower layer 120. The second metal layer 112 may overlap the third metal layer 113.

The first metal layer 111 may be located between the third interlayer insulating layer 210 and the first organic insulating layer 211, and may be formed together in the same process as the bypass portions DL-C1 (see FIG. 6) of some of the data lines and the node connection line 166 described with reference to FIG. 6.

Adjacent first metal layers 111 may be spaced apart from each other. For example, two adjacent first metal layers 111 may be spaced apart from each other with the lower layer 120 disposed therebetween. In other words, two adjacent first metal layers 111 may be located on both sides of the lower layer 120. The first metal layer 111 may overlap the second metal layer 112 and the third metal layer 113.

The first organic insulating layer 211 may be formed on the first metal layer 111 and may overlap the openings 2090P and 210OP of the second gate insulating layer 209 and the third interlayer insulating layer 210. The first organic insulating layer 211 may include the dummy contact hole 211DCH overlapping the first metal layer 111. In this regard, in FIG. 12A, the dummy contact holes 211DCH overlap the first metal layers 111 located on both sides of the lower layer 120. Two neighboring dummy contact holes 211DCH may be located on both sides of the lower layer 120.

The metal pattern layer 212 may be formed on the first organic insulating layer 211 in which the dummy contact hole 211DCH is formed. The metal pattern layer 212 may be formed by entirely forming a metal material layer on the first organic insulating layer 211 and then patterning the metal material layer by using a mask such as a photoresist. Due to the patterning of the metal material layer, the metal pattern layers 212 spaced apart from each other may be formed on the first organic insulating layer 211. Two neighboring metal pattern layers 212 may be located on both sides of the lower layer 120. The metal pattern layer 212 may directly contact the first metal layer 111 located under the metal pattern layer 212 through the dummy contact hole 211DCH. Due to the contact between the metal pattern layer 212 and the first metal layer 111, moisture may be prevented from penetrating through the first organic insulating layer 211. The metal pattern layer 212 and the first metal layer 111 may be in an electrically floating state (i.e., a state where a voltage or current is not applied), and thus, the first dummy contact hole 211DCH of the first organic insulating layer 211 for contact between the metal pattern layer 212 and the first metal layer 111 may be distinguished from a contact hole (e.g., the first contact hole CNT1 of FIG. 6) for electrical connection.

Two neighboring metal pattern layers 212 may be spaced apart from each other by a first interval IV1. The first interval IV1 corresponds to a distance (e.g., a horizontal distance) between end portions of the two neighboring metal pattern layers 212. Through the first interval IV1, a portion of the first organic insulating layer 211 (e.g., a portion of the first organic insulating layer 211 overlapping the openings 2090P and 210OP of the second gate insulating layer 209 and the third interlayer insulating layer 210) may be exposed.

Referring to FIG. 12B, the second organic insulating layer 213 is formed on the two metal pattern layers 212. The second organic insulating layer 213 may include an opening 213P OP overlapping the first interval IV1 (see FIG. 12A). The second organic insulating layer 213 may include a first portion 213a and a second portion 213b located on both sides of the opening 213P_OP. The second organic insulating layer 213 may be spaced apart from each other with a third interval IV3 disposed therebetween. The third interval IV3 may correspond to a width of the opening 213P_OP of the second organic insulating layer 213. The opening 213P_OP of the second organic insulating layer 213 may overlap the lower layer 120 and the openings 2090P and 210OP of the second gate insulating layer 209 and the third interlayer insulating layer 210. The opening 213P_OP of the second organic insulating layer 213 of FIG. 12B is a previous state of an opening 2130P of the second organic insulating layer 213 formed in a process described below with reference to FIG. 12C, and for convenience of explanation, the opening 213P_OP will be referred to as a preliminary opening to be distinguished from the opening 2130P of the second organic insulating layer 213 that is finally formed.

A width of the preliminary opening 213P_OP of the second organic insulating layer 213 may be less than the first interval IV1 (see FIG. 12A). The first portion 213a and the second portion 213b of the second organic insulating layer 213 may entirely cover the metal pattern layers 212 disposed under the first portion 213a and the second portion 213b. For example, two metal pattern layers 212 may include portions facing each other, and the end portions of the two metal pattern layers 212 may be covered by the second organic insulating layer 213. In this regard, in FIG. 12B, a side surface 212IS of an end portion of the metal pattern layer 212 adjacent to the preliminary opening 213P_OP of the second organic insulating layer 213 is covered by the second organic insulating layer 213.

Each of the first portion 213a and the second portion 2113b of the second organic insulating layer 213 may completely cover the side surface 212IS of the end portion of the metal pattern layer 212 and may further extend toward the preliminary opening 213P_OP, and may directly contact a top surface of the first organic insulating layer 211.

Each of the first portion 213a and the second portion 213b of the second organic insulating layer 213 may include a thick portion and a thin portion. For example, each of the first portion 213a and the second portion 213b of the second organic insulating layer 213 may include a thin portion adjacent to the preliminary opening 213P_OP, and a thick portion far from the preliminary opening 213P_OP with the thin portion disposed therebetween. The thick portion is a portion having a thickness greater than that of the thin portion, and the thin portion is a portion having a thickness less than that of the thick portion. A structure of the second organic insulating layer 213 including the thick portion and the thin portion may be formed by using a halftone mask.

A mask layer 214 may be formed on the second organic insulating layer 213 including the preliminary opening 213P_OP. The mask layer 214 may include a semiconductor material such as indium gallium zinc oxide (IGZO).

The mask layer 214 may include an opening 2140P having a width greater than a width of the preliminary opening 213P_OP of the second organic insulating layer 213. The opening 2140P of the mask layer 214 may overlap the thin portion of the second organic insulating layer 213. In other words, the thin portion of the second organic insulating layer 213 is not covered by the mask layer 214.

The mask layer 214 may include a first portion 214a and a second portion 214b which are spaced apart from each other with the opening 2140P disposed therebetween. The first portion 214a of the mask layer 214 may be located on the thick portion of the first portion 213a of the second organic insulating layer 213, and the second portion 214b of the mask layer 214 may be located on the thick portion of the second portion 213b of the second organic insulating layer 213.

Next, the first organic insulating layer 211 including an opening 2110P is formed as shown in FIG. 12C, by removing a part of the first organic insulating layer 211 overlapping the preliminary opening 213P_OP of the second organic insulating layer 213. A process of removing the first organic insulating layer 211 may be performed by using an etching process. The first organic insulating layer 211 and the second organic insulating layer 213 may include substantially the same organic insulating material, and thus, in an etching process of forming the opening 2110P of the first organic insulating layer 211, a part (e.g., the thin portion) of the second organic insulating layer 213 around the preliminary opening 213P_OP may also be etched. Accordingly, a width of the preliminary opening 213P_OP of the second organic insulating layer 213 may be increased as shown in FIG. 12C, and finally, the opening 2130P through which a part of the metal pattern layer 212 is exposed is formed in the second organic insulating layer 213.

A portion of each metal pattern layer 212 (e.g., a portion including the side surface 212IS of the metal pattern layer 212) may be exposed through the opening 2130P of the second organic insulating layer 213. As a width of the opening 2130P is increased to be greater than a width of the preliminary opening 213P_OP of FIG. 12B, a second interval IV2 between the first portion 213a and the second portion 213b of the second organic insulating layer 213 located on both sides of the opening 2130P may be greater than the third interval IV3 of FIG. 12B. The second interval IV2 may correspond to a width of the opening 2130P of the second organic insulating layer 213.

In an etching process of forming the opening 2110P of the first organic insulating layer 211, the lower layer 120 may function as an etch stopper. A material portion of the first organic insulating layer 211 existing between the lower layer 120 and the preliminary opening 213P_OP of the second organic insulating layer 213 may be removed in a thickness direction of the first organic insulating layer 211 to form the opening 2110P.

The opening 2110P of the first organic insulating layer 211 may overlap the openings 2090P and 210OP of the second gate insulating layer 209 and the third interlayer insulating layer 210. The opening 2110P of the first organic insulating layer 211, and the openings 2090P and 210OP of the second gate insulating layer 209 and the third interlayer insulating layer 210 may overlap each other to form the groove G.

An end portion of the metal pattern layer 212 adjacent to the groove G may include the tip PT protruding toward the groove G. From the point CP at which the side surface 211IS of the first organic insulating layer 211 defining the opening 2110P and a bottom surface of the metal pattern layer 212 meet each other, the metal pattern layer 212 may further extend in the x direction toward the groove G, and the extending portion may correspond to the tip PT. In other words, the tip PT of the metal pattern layer 212 corresponds to a portion (or an end portion) of the metal pattern layer 212 which extends toward the groove G beyond the side surface 211IS of the first organic insulating layer 211.

A structure of the groove G and the tip PT of the metal pattern layer 212 may be formed by a process described with reference to FIGS. 12A through 12C, or may be formed by a process illustrated in FIGS. 13A through 13D.

FIGS. 13A through 13D are cross-sectional views illustrating a process of forming a structure of a groove and a tip PT of the metal pattern layer 212 according to an embodiment. A structure of a groove and a tip of FIG. 8 may be formed through a process of FIGS. 13A through 13D.

Figure 13A:
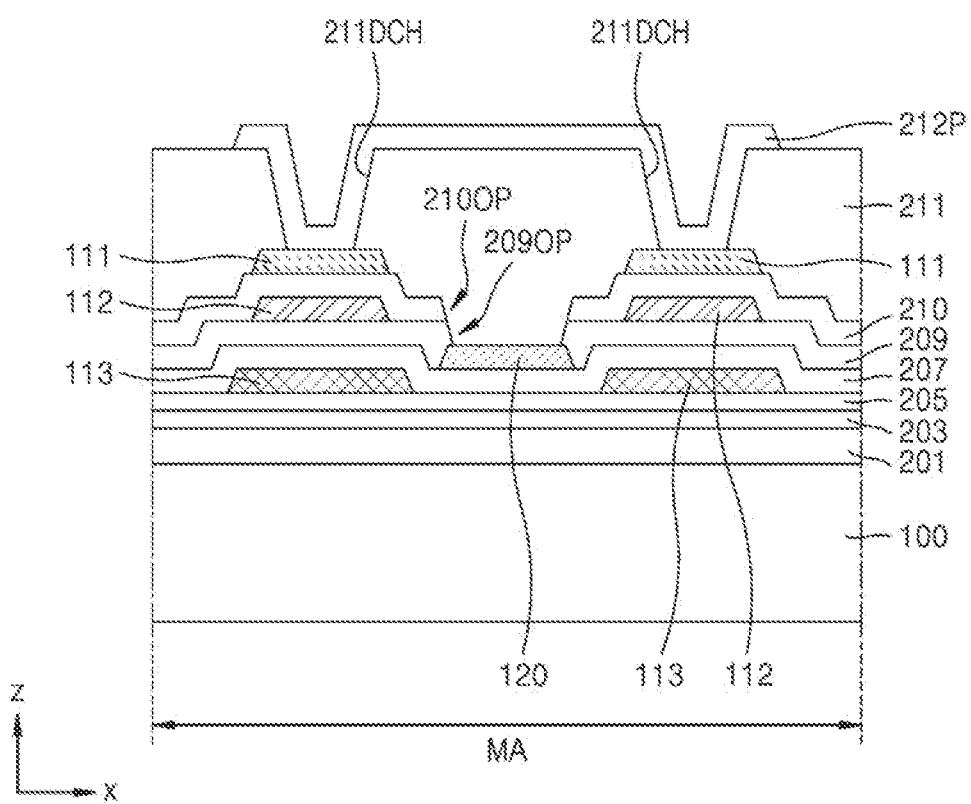
FIGS. 13A, 13B, 13C and 13D are cross-sectional views illustrating a process of forming a structure of a groove and a tip of a display panel, according to an embodiment.

Referring to FIG. 13A, a metal material layer 212P is formed on the first organic insulating layer 211. Before the metal material layer 212P is formed on the first organic insulating layer 211, a plurality of insulating layers, metal layers, and the lower layer 120 may be formed on the substrate 100. In this regard, in FIG. 13A, the insulating layers formed on the substrate 100 include the buffer layer 201, the first gate insulating layer 203, the first interlayer insulating layer 205, the second interlayer insulating layer 207, the second gate insulating layer 209, and the third interlayer insulating layer 210. In FIG. 13A, before the metal material layer 212P is formed on the first organic insulating layer 211, the first through third metal layers 111, 112, and 113 and the lower layer 120 are formed. The buffer layer 201, the first gate insulating layer 203, the first interlayer insulating layer 205, the second interlayer insulating layer 207, the second gate insulating layer 209, the third interlayer insulating layer 210, the first through third metal layers 111, 112, and 113, and the lower layer 120 may be formed through the same process as those described with reference to FIG. 12A.

The first organic insulating layer 211 may be formed on the first metal layer 111, and may overlap the openings 2090P and 210OP of the second gate insulating layer 209 and the third interlayer insulating layer 210. The first organic insulating layer 211 may include the dummy contact hole 211DCH overlapping the first metal layer 111. In this regard, in FIG. 13A, the dummy contact holes 211DCH respectively overlap the first metal layers 111 located on both sides of the lower layer 120. Two neighboring dummy contact holes 211DCH may be located on both sides of the lower layer 120.

The metal material layer 212P may be formed on the first organic insulating layer 211. The metal material layer 212P may be formed by patterning a metal layer using a mask such as a photoresist. The metal material layer 212P may include aluminum (Al), copper (Cu), and/or titanium (Ti), and may have a single or multi-layer structure including the above material.

The metal material layer 212P may directly contact the first metal layer 111 through the dummy contact hole 211DCH. Moisture penetrated through the first organic insulating layer 211 may be blocked by the metal material layer 212P covering side surfaces of the first organic insulating layer 211.

The metal material layer 212P may overlap the openings 2090P and 210OP of the second gate insulating layer 209 and the third interlayer insulating layer 210. In an embodiment, the metal material layer 212P may overlap the openings 2090P and 210OP of the second gate insulating layer 209 and the third interlayer insulating layer 210 while contacting two neighboring first metal layers 111 through the dummy contact holes 211DCH formed in the first organic insulating layer 211. The metal material layer 212P may entirely cover a top surface of a portion of the first organic insulating layer 211 located between the two neighboring first metal layers 111. In other words, the metal material layer 212P may entirely cover a top surface of a portion of the first organic insulating layer 211 between two neighboring dummy contact holes 211DCH.

Figure 13B:
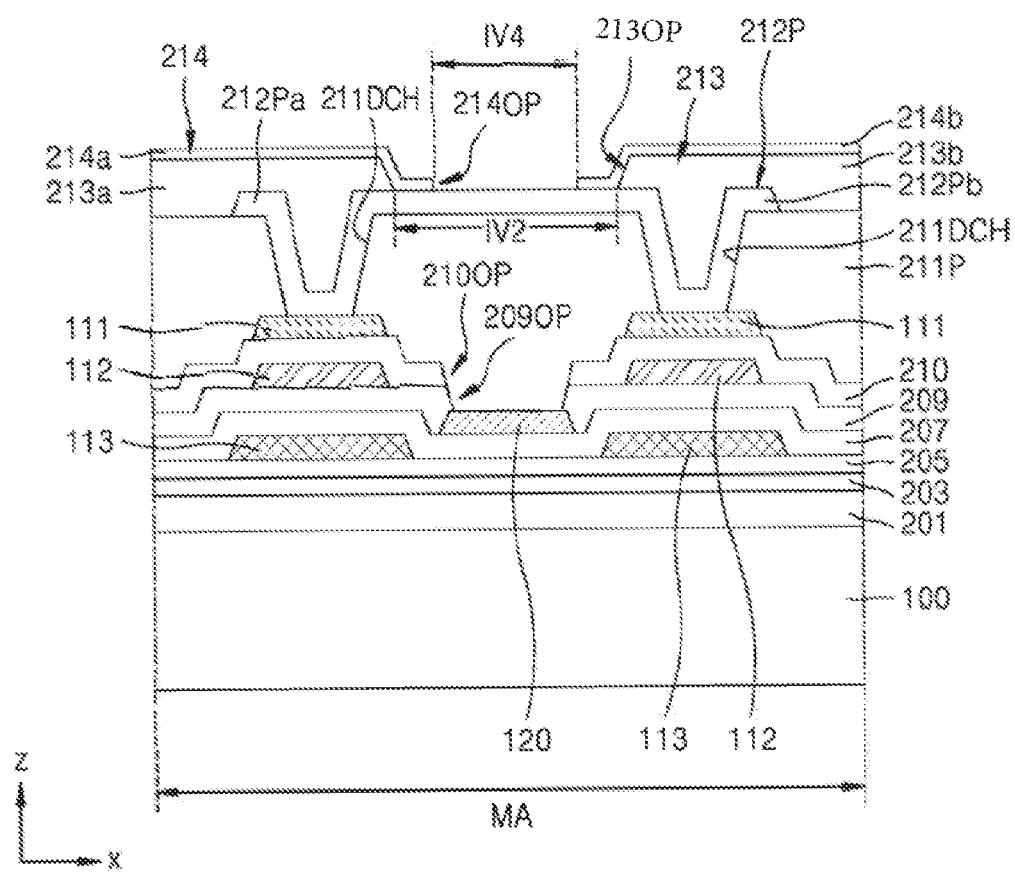

Referring to FIG. 13B, the second organic insulating layer 213 and the mask layer 214 may be formed on the metal material layer 212P.

The second organic insulating layer 213 may include the opening 2130P overlapping the lower layer 120. The opening 2130P of the second organic insulating layer 213 may overlap the lower layer 120 and the openings 2090P and 210OP of the second gate insulating layer 209 and the third interlayer insulating layer 210. The second organic insulating layer 213 may include the first portion 213a and the second portion 213b which are located on both sides of the opening 2130P and are spaced apart from each other with the opening 2130P disposed therebetween. For example, the first portion 213a of the second organic insulating layer 213 may cover a first portion 212Pa of the metal material layer 212P which overlaps and contacts any one first metal layer 111, and the second portion 213b of the second organic insulating layer 213 may cover a second portion 212Pb of the metal material layer 212P which overlaps and contacts the other first metal layer 111. The first portion 212Pa and the second portion 212Pb of the metal material layer 212P correspond to a portion of the metal material layer 212P which is integrally formed.

The first portion 213a and the second portion 213b of the second organic insulating layer 213 may be spaced apart from each other by the second interval IV2. A width of the opening 2130P of the second organic insulating layer 213 may correspond to the second interval IV2.

The mask layer 214 may be formed on the second organic insulating layer 213. The mask layer 214 may include a semiconductor material such as IGZO. The mask layer 214 may include the opening 2140P having a width less than a width of the opening 2130P of the second organic insulating layer 213.

The mask layer 214 may include the first portion 214a and the second portion 214b which are spaced apart from each other with the opening 2140P disposed therebetween. The first portion 214a of the mask layer 214 may be located on the first portion 213a of the second organic insulating layer 213 and the second portion 214b of the mask layer 214 may be located on the second portion 213b of the second organic insulating layer 213. The first portion 214a and the second portion 214*b* of the mask layer 214 may be spaced apart from each other by a fourth interval IV4. A width of the opening 2140P of the mask layer 214 may correspond to the fourth interval IV4.

The fourth interval IV4 may overlap the second interval IV2, and may be less than the second interval IV2. The first portion 214*a* of the mask layer 214 may extend to cover a side surface of the first portion 213*a* of the second organic insulating layer 213, and an end portion of the first portion 214*a* of the mask layer 214 may contact a top surface of the metal material layer 212P. The second portion 214*b* of the mask layer 214 may extend to cover a side surface of the second portion 213*b* of the second organic insulating layer 213 and an end portion of the second portion 214*b* of the mask layer 214 may contact a top surface of the metal material layer 212P.

After the mask layer 214 is formed, a part of the metal material layer 212P and a part of the first organic insulating layer 211 may be removed by using the mask layer 214 as an etching mask. In this regard, FIG. 13C is a cross-sectional view illustrating a process of removing a part of the metal material layer 212P by using the mask layer 214 as an etching mask, and FIG. 13D is a cross-sectional view illustrating a process of removing a part of the first organic insulating layer 211 by using the mask layer 214.

Figure 13C:
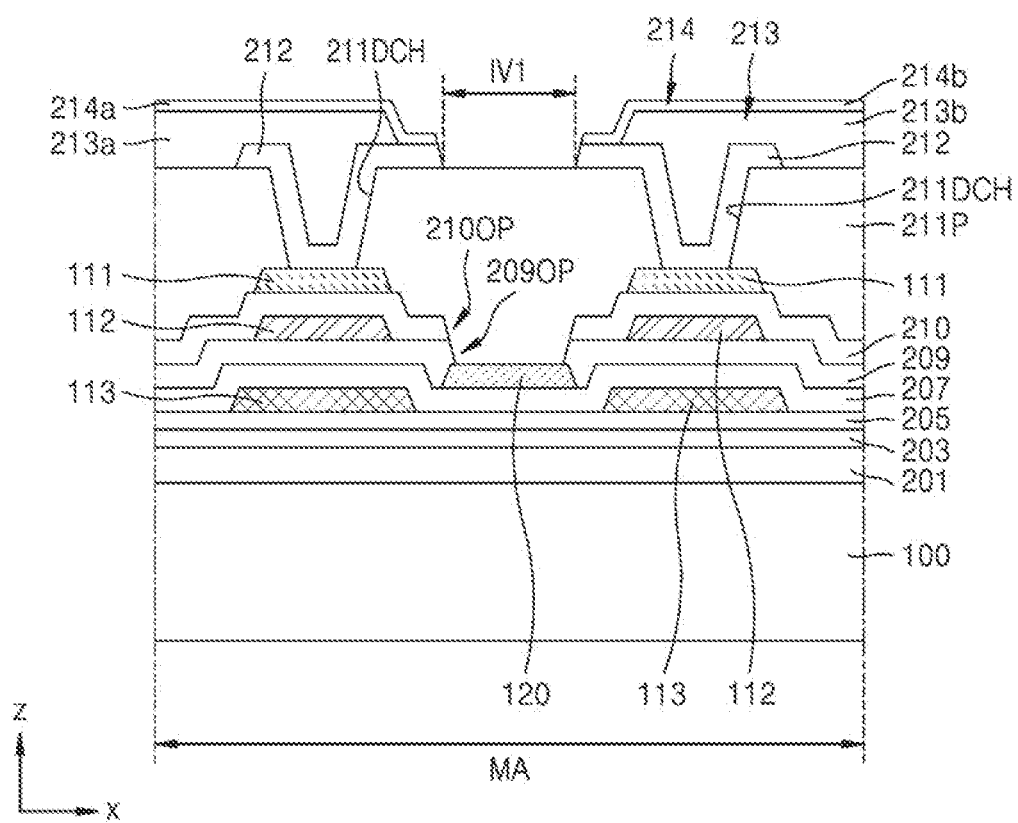

Referring to FIGS. 13B and 13C, a part of the metal material layer 212P is removed by using the mask layer 214 as an etching mask. A part of the metal material layer 212P may be removed by using an etching process. A part of the metal material layer 212P which is removed may be a portion overlapping the opening 2140P of the mask layer 214.

When a part of the metal material layer 212P is removed, as shown in FIG. 13C, the metal pattern layers 212 which may be spaced apart from each other with the first interval IV1 disposed therebetween may be formed on the first organic insulating layer 211. The first interval IV1 may be substantially the same as the fourth interval IV4.

Figure 13D:
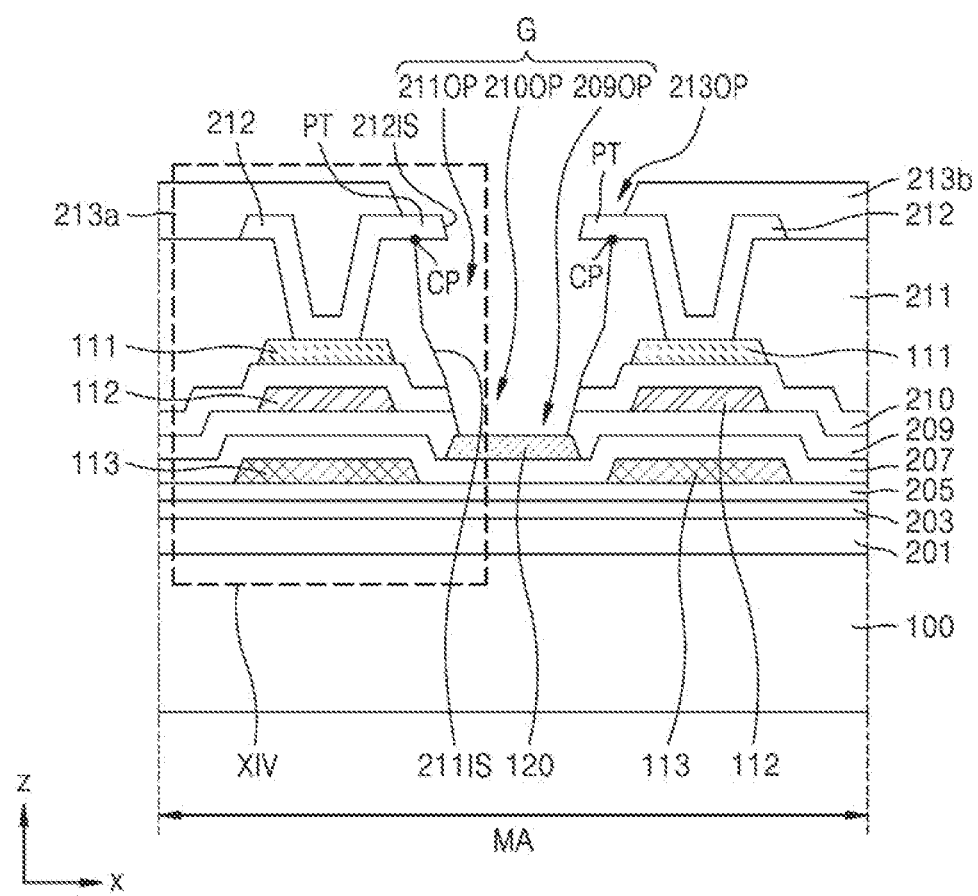

Referring to FIGS. 13C and 13D, a part of the first organic insulating layer 211 is removed by using the mask layer 214 as an etching mask. A part of the first organic insulating layer 211 may be removed by using an etching process. A part of the first organic insulating layer 211 which is removed is a portion overlapping the opening 2140P of the mask layer 214. A part of the first organic insulating layer 211 which is removed may overlap a space between the metal pattern layers 212, for example, the first interval IV1.

When a part of the first organic insulating layer 211 is removed, as shown in FIG. 13D, the opening 2110P may be formed in the first organic insulating layer 211. Next, the mask layer 214 is removed.

In an etching process of forming the opening 2110P of the first organic insulating layer 211, the lower layer 120 may function as an etch stopper. Materials existing between the metal pattern layers 212 and the lower layer 120 may be removed in a thickness direction of the first organic insulating layer 211 to form the opening 2110P.

The opening 2110P of the first organic insulating layer 211 may overlap the openings 2090P and 210OP of the second gate insulating layer 209 and the third interlayer insulating layer 210. The opening 2110P of the first organic insulating layer 211, and the openings 2090P and 210OP of the second gate insulating layer 209 and the third interlayer insulating layer 210 may overlap one another to form the groove G.

An end portion of the metal pattern layer 212 adjacent to the groove G may include the tip PT protruding toward the groove G. From the point CP at which the side surface 211IS of the first organic insulating layer 211 defining the opening 2110P and a bottom surface of the metal pattern layer 212 meet each other, the metal pattern layer 212 may further extend in the x direction toward the groove G, and the extending portion may correspond to the tip PT. In other words, the tip PT of the metal pattern layer 212 corresponds to a portion (or an end portion) of the metal pattern layer 212 which extends toward the groove G beyond the side surface 211IS of the first organic insulating layer 211.

Figure 14A:
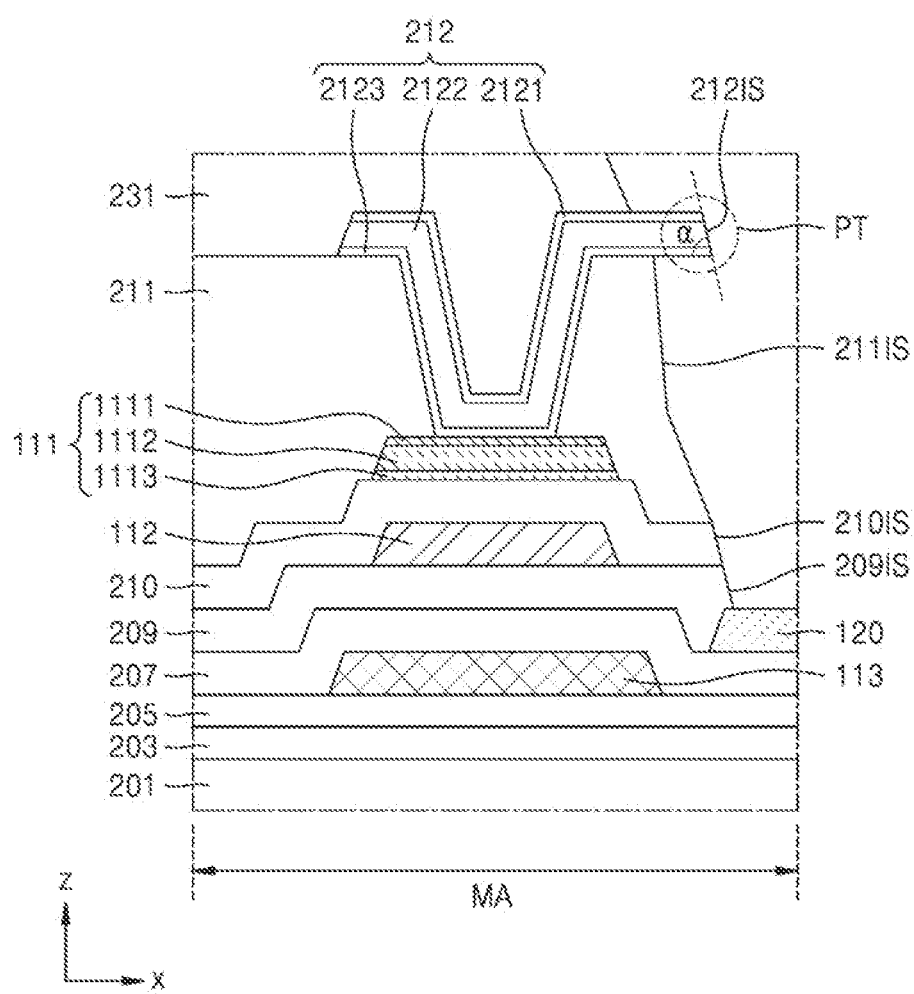
FIGS. 14A and 14B are enlarged views illustrating a portion XIV of FIG. 12C and the portion XIV of FIG. 13D.

FIG. 14A is an enlarged cross-sectional view illustrating a structure of a groove and a tip, according to an embodiment. FIG. 14A is an enlarged view illustrating a portion XIV of FIG. 12C and the portion XIV of FIG. 13D.

Figure 14B:
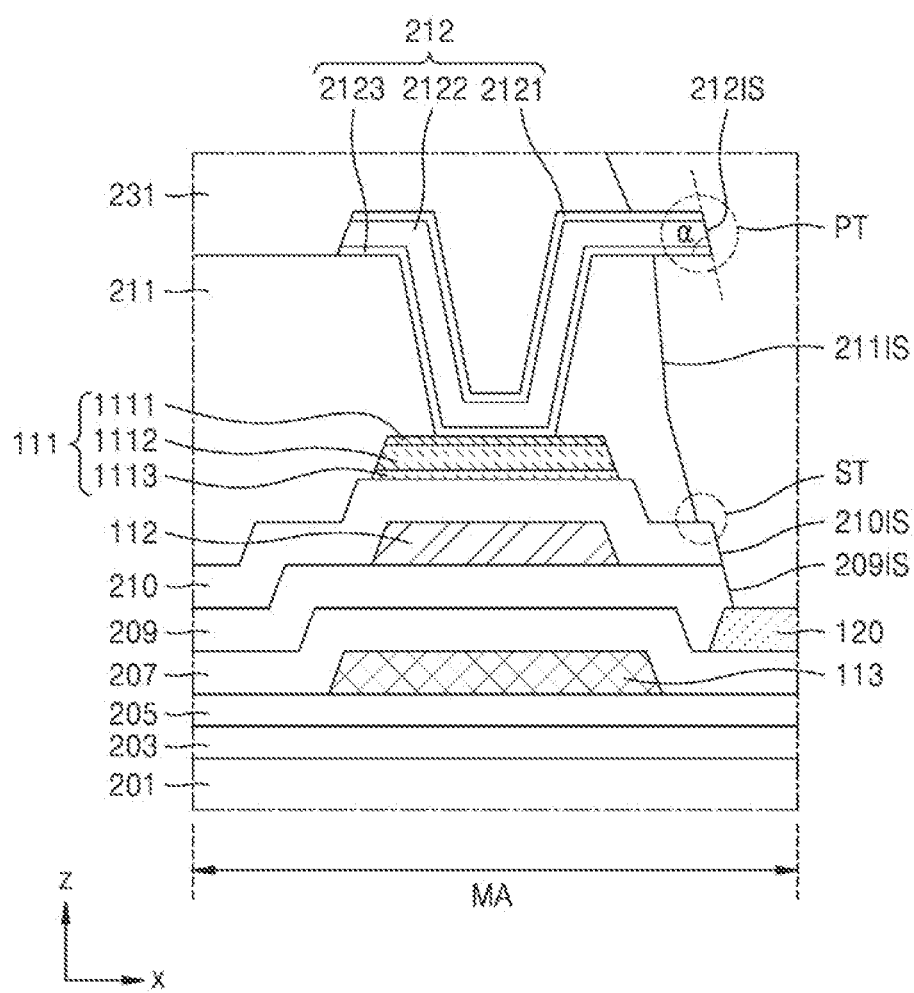

Referring to FIGS. 14A and 14B, in an embodiment, the metal pattern layer 212 may include a plurality of sub-metal layers. For example, the metal pattern layer 212 may include first through third sub-metal pattern layers 2121, 2122, and 2123. The first through third sub-metal pattern layers 2121, 2122, and 2123 may respectively include metal elements such as aluminum (Al), copper (Cu), and titanium (Ti). In an embodiment, the first sub-metal pattern layer 2121 may be a titanium layer, the second sub-metal pattern layer 2122 may be an aluminum layer, and the third sub-metal pattern layer 2123 may be a titanium layer.

In an embodiment, the first metal layer 111 may also include a plurality of sub-metal layers. For example, the first metal layer 111 may include first through third sub-metal layers 1111, 1112, and 1113. The first through third sub-metal layers 1111, 1112, and 1113 may respectively include metal elements such as Al, Cu, and Ti. In an embodiment, the first sub-metal layer 1111 may be a titanium layer, the second sub-metal layer 1112 may be an aluminum layer, and the third sub-metal layer 1113 may be a titanium layer.

Because at least two sub-metal pattern layers from among the first through third sub-metal pattern layers 2121, 2122, and 2123 include different metal elements, the more an end portion of the metal pattern layer 212 (e.g., an end portion corresponding to the tip PT) is exposed during an etching process in a process of manufacturing a display panel, the more the side surface 212IS of the end portion of the metal pattern layer 212 may have an irregular shape. For example, metal particles such as aluminum may be agglomerated with an end portion of the metal pattern layer 212 to have an irregular shape, and in this case, unexpected defects may occur.

However, according to a process described with reference to FIGS. 12A through 12C, end portions of two metal pattern layers 212, for example, the side surfaces 212IS of the two metal pattern layers 212, are covered by the second organic insulating layer 213 as shown in FIG. 12B, the side surface 212IS of the metal pattern layer 212 or the side surface 212IS of the tip PT which is finally formed may be disposed on the same plane as shown in FIGS. 14A and 14B. The side surface 212IS of the metal pattern layer 212 may be located on a forwardly tapered inclined surface having a first angle α with respect to a bottom surface of the metal pattern layer 212. In other words, the first through third sub-metal layers 1111, 1112, and 1113 may be located on the forwardly tapered inclined surface with respect to the bottom surface of the metal pattern layer 212 without steps formed between adjacent sub-metal layers.

According to a process described with reference to FIGS. 13A through 13D, a process of removing a part of the metal material layer 212P and a process of removing a part of the first organic insulating layer 211 are performed by using the same mask layer 214. Accordingly, in a process of manufacturing a display panel, an end portion of the metal pattern layer 212 may be minimized from being exposed in an etching process. Also, because an etching material for removing a part of the metal material layer 212P and an etching material for removing a part of the first organic insulating layer 211 are different from each other, an end portion (e.g., the tip PT) of the metal pattern layer 212 is not damaged during an etching process for removing a part of the first organic insulating layer 211. Hence, the side surface 212IS of the metal pattern layer 212 or the side surface 212IS of the tip PT which is finally formed may be disposed on the same plane as shown in FIGS. 14A and 14B. For example, the side surface 212IS of the metal pattern layer 212 may be disposed on a forwardly tapered inclined surface having the first angle α with respect to a bottom surface of the metal pattern layer 212, and each may be disposed on the forwardly tapered inclined surface with respect to the bottom surface of the metal pattern layer 212 without steps formed between adjacent sub-metal layers.

Referring to a process described with reference to FIGS. 12A through 12C, processes of removing the metal pattern layer 212 and the first organic insulating layer 211 are formed by using separate masks. Also, as shown in FIG. 12B, because the second organic insulating layer 213 should cover the side surface 212IS of each of the metal pattern layers 212, positions of the metal pattern layers 212, for example, the first interval IV1, should be considered when the preliminary opening 213P_OP is formed. In contrast, according to a process described with reference to FIGS. 13A through 13D, because an etching process for forming the metal pattern layer 212 and an etching process for forming the opening 2110P of the first organic insulating layer 211 are performed by using the same mask layer 214, a position of the opening 2130P of the second organic insulating layer 213 may not be limited, unlike in FIGS. 12A through 12C. Accordingly, a process variation according to alignment during a process of manufacturing a display panel may be minimized.

Referring to FIG. 14A, although the side surface 211IS of the first organic insulating layer 211 and a side surface of an inorganic insulating layer (e.g., the side surface 209IS of the second gate insulating layer 209 and the side surface 210IS of the third interlayer insulating layer 210) under the first organic insulating layer 211 are relatively smoothly connected, the disclosure is not limited thereto. As shown in FIG. 14B, the side surface 211IS of the first organic insulating layer 211 may have a step difference ST from the side surface 209IS of the second gate insulating layer 209 and the side surface 210IS of the third interlayer insulating layer 210.

A display panel according to embodiments may minimize a process margin and may prevent unexpected defects in forming a structure of a groove and a tip located around an opening area. However, such effects are merely examples and effects according to embodiments are described in detail through the description.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by one of ordinary skill in the art that various changes in form and details may be made therein without departing from the spirit and scope as defined by the following claims.

What is claimed is:

1. A method of manufacturing a display panel, the method comprising:
preparing a substrate comprising a first area, a second area surrounding the first area, and a third area disposed between the first area and the second area;
forming a first organic insulating layer in the third area;
forming a metal material layer in the third area on the first organic insulating layer;
forming a mask layer on the metal material layer, the mask layer comprising a first portion and a second portion spaced apart from each other;
removing the metal material layer and the first organic insulating layer exposed by the mask layer by using the mask layer as a mask; and
forming a light-emitting diode in the second area,
wherein the removing of the metal material layer and the first organic insulating layer comprises:
forming two metal pattern layers spaced apart from each other by a first interval by removing the metal material layer exposed by the mask layer,
forming an opening in the first organic insulating layer by removing the first organic insulating layer exposed by the mask layer, and
removing the mask layer,
wherein the forming of the opening in the first organic insulating layer comprises etching the first organic insulating layer using a lower layer disposed below the first organic insulating layer in an area corresponding to the opening as an etch stopper,
wherein the lower layer includes an oxide-based semiconductor material forming a channel region of a transistor included in a pixel circuit, and
wherein the lower layer is located on an interlayer insulating layer and the interlayer insulating layer extends over at least a storage capacitor.

2. The method of claim 1, wherein the first organic insulating layer includes a recessed portion exposing bottom surfaces of the two metal pattern layers, and
wherein end portions of the two metal pattern layers comprise tips extending toward a center of the opening.

3. The method of claim 1, further comprising forming a second organic insulating layer located on the two metal pattern layers and comprising a first portion and a second portion spaced apart from each other by a second interval.

4. The method of claim 3, wherein the second interval is greater than the first interval.

5. The method of claim 1, further comprising forming an inorganic insulating material under the first organic insulating layer, the inorganic insulating material comprising an opening disposed in a region corresponding to a region exposed by the mask layer.

6. The method of claim 1, further comprising forming first metal layers disposed under the first organic insulating layer and spaced apart from each other with the first organic insulating layer disposed therebetween.

7. The method of claim 6, wherein the forming of the first organic insulating layer comprises forming dummy contact holes exposing the first metal layers.

8. The method of claim 7, wherein the metal material layer contacts the first metal layers through the dummy contact holes.

9. A method of manufacturing a display panel, the method comprising:
preparing a substrate comprising a first area, a second area surrounding the first area, and a third area disposed between the first area and the second area;

forming a first organic insulating layer in the third area;

forming two metal pattern layers in the third area on the first organic insulating layer, wherein the two metal pattern layers are spaced apart from each other by a first interval;

forming a second organic insulating layer comprising an opening in a region corresponding to the first interval;

removing the first organic insulating layer exposed by the opening in the second organic insulating layer; and forming a light-emitting diode in the second area, wherein the removing of the first organic insulating layer comprises etching the first organic insulating layer using a lower layer disposed below the first organic insulating layer in an area corresponding to the opening as an etch stopper, wherein the lower layer includes an oxide-based semiconductor material forming a channel region of a transistor included in a pixel circuit, and wherein the lower layer is located on an interlayer insulating layer and the interlayer insulating layer extends over at least a storage capacitor.

10. The method of claim 9, wherein a width of the opening in the second organic insulating layer is less than the first interval.

11. The method of claim 9, wherein the two metal pattern layers comprise end portions facing each other, and each side surface of the end portions of the two metal pattern layers is covered by the second organic insulating layer.

12. The method of claim 11, wherein a width of the opening in the second organic insulating layer is increased during the etching to expose the end portions of the two metal pattern layers through the opening in the second organic insulating layer.

13. The method of claim 9, further comprising forming an inorganic insulating material under the first organic insulating layer, the inorganic insulating material comprising an opening disposed in the region corresponding to the first interval.

14. The method of claim 9, further comprising forming first metal layers disposed under the first organic insulating layer and spaced apart from each other with the first organic insulating layer disposed therebetween.

15. The method of claim 14, wherein the forming of the first organic insulating layer comprises forming a dummy contact hole exposing the first metal layers.

16. The method of claim 15, wherein each of the two metal pattern layers contacts each of the first metal layers through the dummy contact hole.

* * * * *